United States Patent
Shibata et al.

(10) Patent No.: US 12,114,438 B2
(45) Date of Patent: Oct. 8, 2024

(54) MANUFACTURING METHOD FOR DOUBLE-SIDED WIRING CIRCUIT BOARD AND DOUBLE-SIDED WIRING CIRCUIT BOARD

(71) Applicant: NITTO DENKO CORPORATION, Osaka (JP)

(72) Inventors: Shusaku Shibata, Osaka (JP); Rihito Fukushima, Osaka (JP); Teppei Niino, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 151 days.

(21) Appl. No.: 17/783,546

(22) PCT Filed: Nov. 12, 2020

(86) PCT No.: PCT/JP2020/042343
§ 371 (c)(1),
(2) Date: Jun. 8, 2022

(87) PCT Pub. No.: WO2021/124747
PCT Pub. Date: Jun. 24, 2021

(65) Prior Publication Data
US 2023/0008736 A1 Jan. 12, 2023

(30) Foreign Application Priority Data
Dec. 17, 2019 (JP) ................. 2019-226977

(51) Int. Cl.
*H05K 3/40* (2006.01)
*H05K 1/02* (2006.01)
(Continued)

(52) U.S. Cl.
CPC ......... *H05K 3/4084* (2013.01); *H05K 1/0298* (2013.01); *H05K 1/05* (2013.01);
(Continued)

(58) Field of Classification Search
None
See application file for complete search history.

(56) References Cited

U.S. PATENT DOCUMENTS 4,490,429 A * 12/1984 Tosaki ................. H05K 1/0306
501/6
4,791,239 A * 12/1988 Shirahata ............... H05K 1/056
361/792
(Continued)

FOREIGN PATENT DOCUMENTS

| CN | 1177901 A | * | 4/1998 | ............ H05K 3/207 |
| JP | S61-295691 A | | 12/1986 | |

(Continued)

OTHER PUBLICATIONS

International Search Report issued in PCT/JP2020/042343 on Feb. 2, 2021.
(Continued)

*Primary Examiner* — Timothy J. Dole
*Assistant Examiner* — Muhammed Azam
(74) *Attorney, Agent, or Firm* — Edwards Neils LLC; Jean C. Edwards, Esq.

(57) ABSTRACT

A method for manufacturing a double-sided wiring circuit board includes a first step of preparing a laminate and a second step. The laminate includes a metal core layer, insulating layers, and conductor layers. The insulating layer has a region and an opening that are adjacent to each other. The insulating layer has a region including a part facing the region in a thickness direction, and an opening adjacent to the region. The conductor layer includes a wiring portion and a conductive portion. In the second step, the first and second etching treatments for etching the metal core layer through the openings are carried out to form a via portion having a periphery surrounded by a space, extending
(Continued)

between the regions, and connected to the conductive portions.

6 Claims, 20 Drawing Sheets

(51) Int. Cl.
    *H05K 1/05*           (2006.01)
    *H05K 1/11*           (2006.01)
    *H05K 3/44*           (2006.01)
    *H05K 3/46*           (2006.01)
(52) U.S. Cl.
    CPC ............. *H05K 1/116* (2013.01); *H05K 3/445* (2013.01); *H05K 3/4647* (2013.01); *H05K 2203/0323* (2013.01); *H05K 2203/1484* (2013.01)

(56) References Cited

U.S. PATENT DOCUMENTS

| | | | | | |
|---|---|---|---|---|---|
| 4,935,584 | A * | 6/1990 | Boggs | ............ | H05K 1/115 174/262 |
| 4,963,697 | A * | 10/1990 | Peterson | ............ | H05K 1/0207 361/767 |
| 5,072,075 | A * | 12/1991 | Lee | ............ | H05K 3/4641 29/830 |
| 5,403,978 | A * | 4/1995 | Drabek | ............ | H05K 3/4084 174/262 |
| 5,590,030 | A * | 12/1996 | Kametani | ............ | H05K 3/4641 361/795 |
| 5,616,256 | A * | 4/1997 | Demura | ............ | H05K 3/42 216/17 |
| 6,316,738 | B1 * | 11/2001 | Mori | ............ | H05K 1/0201 174/255 |
| 6,335,076 | B1 * | 1/2002 | Nakamura | ............ | H05K 3/462 428/209 |
| 6,740,246 | B2 * | 5/2004 | Glovatsky | ............ | H05K 3/44 29/829 |
| 7,732,900 | B2 * | 6/2010 | Kanagawa | ............ | H05K 1/112 257/676 |
| 7,872,200 | B2 * | 1/2011 | Yokai | ............ | H05K 3/363 174/254 |
| 8,351,743 | B2 * | 1/2013 | Naito | ............ | G11B 5/486 385/39 |
| 8,367,538 | B2 * | 2/2013 | Lee | ............ | H05K 13/00 438/622 |
| 8,452,136 | B2 * | 5/2013 | Nishio | ............ | G11B 5/4806 385/88 |
| 8,525,037 | B2 * | 9/2013 | Mizutani | ............ | G11B 5/484 174/254 |
| 8,647,517 | B2 * | 2/2014 | Yokai | ............ | H05K 1/0269 174/250 |
| 8,669,479 | B2 * | 3/2014 | Ishii | ............ | G11B 5/486 361/767 |
| 8,869,391 | B2 * | 10/2014 | Kamei | ............ | H05K 3/421 430/311 |
| 9,072,207 | B2 * | 6/2015 | Ooyabu | ............ | G11B 5/4833 |
| 9,093,090 | B2 * | 7/2015 | Ohsawa | ............ | G11B 5/486 |
| 9,125,314 | B2 * | 9/2015 | Qu | ............ | H05K 3/403 |
| 9,301,406 | B2 * | 3/2016 | Higuchi | ............ | H05K 3/421 |
| 9,338,888 | B2 * | 5/2016 | Kanezaki | ............ | G11B 5/5552 |
| 9,865,287 | B2 * | 1/2018 | Tanabe | ............ | H05K 1/184 |
| 9,980,386 | B1 * | 5/2018 | Li | ............ | H05K 3/462 |
| 10,123,418 | B1 * | 11/2018 | Lin | ............ | H05K 1/0298 |
| 10,225,930 | B2 * | 3/2019 | Yamauchi | ............ | H05K 3/44 |
| 2001/0004944 | A1 * | 6/2001 | Nakamura | ............ | H05K 3/4038 174/262 |
| 2008/0283277 | A1 | 11/2008 | Muramatsu et al. | | |
| 2009/0057912 | A1 * | 3/2009 | Kheng | ............ | H05K 3/4602 257/774 |
| 2009/0289030 | A1 * | 11/2009 | Ueno | ............ | H05K 3/0035 216/17 |
| 2010/0110590 | A1 | 5/2010 | Ohsawa et al. | | |
| 2013/0221518 | A1 * | 8/2013 | Ishida | ............ | H05K 1/0271 257/737 |
| 2015/0027754 | A1 * | 1/2015 | Shimoda | ............ | C08G 73/1053 524/588 |
| 2015/0319848 | A1 * | 11/2015 | Furutani | ............ | H05K 1/115 361/783 |
| 2016/0135296 | A1 * | 5/2016 | Takano | ............ | B23K 3/02 228/123.1 |
| 2016/0174360 | A1 | 6/2016 | Hsu et al. | | |
| 2017/0231094 | A1 * | 8/2017 | Blackshear | ............ | H05K 1/185 |
| 2018/0213642 | A1 | 7/2018 | Sugiyama et al. | | |
| 2020/0146139 | A1 * | 5/2020 | DeRoy | ............ | H05K 1/115 |
| 2020/0389969 | A1 * | 12/2020 | Ikeda | ............ | H05K 1/025 |
| 2022/0037074 | A1 * | 2/2022 | Tashiro | ............ | H02M 1/0054 |
| 2023/0008736 | A1 * | 1/2023 | Shibata | ............ | H05K 1/0298 |

FOREIGN PATENT DOCUMENTS

| | | | | |
|---|---|---|---|---|
| JP | 63261736 | A * | 10/1988 | |
| JP | 2004-031731 | A | 1/2004 | |
| JP | 2005322807 | A * | 11/2005 | ......... H05K 1/0222 |
| JP | H0821777 | B2 * | 8/2007 | |
| JP | 2010-108576 | A | 5/2010 | |
| JP | 2018-120968 | A | 8/2018 | |
| KR | 20070082492 | A * | 3/1996 | |
| TW | 200850101 | A | 12/2008 | |
| TW | 201309128 | A * | 2/2013 | ....... H01L 23/49822 |
| TW | 201622508 | A | 6/2016 | |

OTHER PUBLICATIONS

Written Opinion issued in PCT/JP2020/042343 on Feb. 2, 2021.
International Preliminary Report on Patentability issued by WIPO on May 17, 2022, in connection with International Patent Application No. PCT/JP2020/042343.
Office Action, issued by the Taiwanese Intellectual Property Office on Jul. 26, 2024, in connection with Taiwanese Patent Application No. 109140539.

* cited by examiner

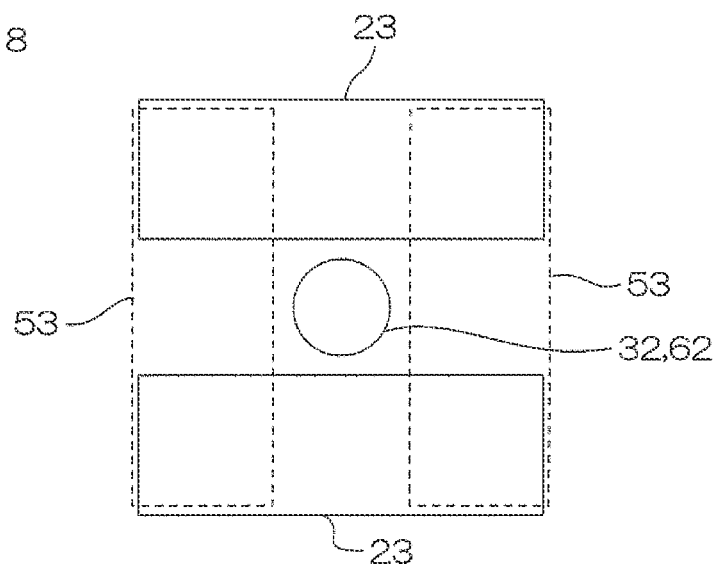
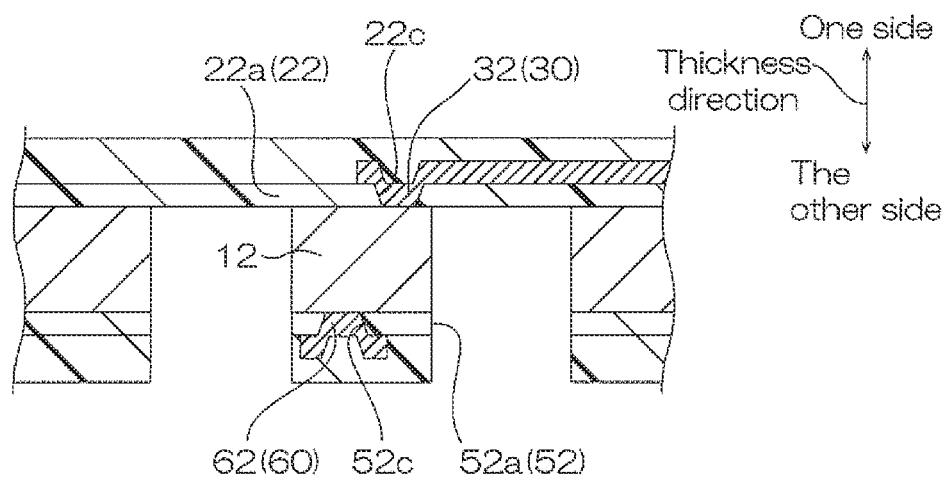

MANUFACTURING METHOD FOR DOUBLE-SIDED WIRING CIRCUIT BOARD AND DOUBLE-SIDED WIRING CIRCUIT BOARD

CROSS-REFERENCE TO RELATED APPLICATIONS

The present application is a 35 U.S.C. 371 National Stage Entry of: PCT/JP2020/042343, filed on Nov. 12, 2020, which claims priority from Japanese Patent Application No. 2019-226977, filed on Dec. 17, 2019, the contents of all of which are herein incorporated by reference in their entirety.

TECHNICAL FIELD

The present invention relates to a method for manufacturing a double-sided wiring circuit board and a double-sided wiring circuit board.

BACKGROUND ART

Some wiring circuit boards have a structure in which both surfaces of the board are each provided with a circuit to achieve high-density wiring, Such a double-sided wiring circuit board requires the electrical connection between the circuits on both the surfaces. The electrical connection requires, for example, forming a conductive structure, such as a via penetrating the core layer to be located between the circuits on both the surfaces of the final product in the thickness direction, in the production process of the double-sided wiring circuit board. The techniques related to the method for manufacturing such a double-sided wiring circuit board are described in, for example, the following Patent document 1.

CITATION LIST

Patent Document

Patent Document 1: Japanese Unexamined Patent Publication No. 2018-120968

SUMMARY OF THE INVENTION

Problem to be Solved by the Invention

When the double-sided wiring circuit board has a metal core layer, the conductive structure, which electrically connects the circuits on both the surfaces as described above, is conventionally formed in the metal core layer with being insulated from the metal core layer by, for example, surrounding the conductive structure with an insulating film. The formation of such a conductive structure needs additional steps. It is not desirable in light of production efficiency to take many steps to form the conductive structure in the manufacturing process of the double-sided wiring circuit board.

The present invention provides a method for manufacturing a double-sided wiring circuit board suitable to efficiently manufacture a double-sided wiring circuit board having a metal core layer, and provides a double-sided wiring circuit board.

Means for Solving the Problem

The present invention [1] includes a manufacturing method for a double-sided wiring circuit board, the method including: a first step of preparing a laminate including a metal core layer, a first insulating layer disposed at one side in a thickness direction of the metal core layer, and having a first region and at least one first opening adjacent to the first region, the first region having a first hole, a first conductor layer having a first wiring portion and a first conductive portion, the first wiring portion being disposed at least on the first region at one side in the thickness direction of the first insulating layer, the first conductive portion being disposed in the first hole and connected to the first wiring portion and the metal core layer, a second insulating layer disposed at the other side in the thickness direction of the metal core layer, and having a second region and at least one second opening adjacent to the second region, the second region including a part facing to the first region in the thickness direction, the second region having a second hole in the part, and a second conductor layer having a second wiring portion and a second conductive portion, the second wiring portion being disposed at least on the second region at the other side in the thickness direction of the second insulating layer, the second conductive portion being disposed in the second hole and connected to the second wiring portion and the metal core layer; and a second step of forming a via portion in the metal core layer by a first etching treatment on the metal core layer through the first opening from one side in the thickness direction of the laminate, and by a second etching treatment on the metal core layer through the second opening from the other side in the thickness direction of the laminate, the via portion being surrounded by a space, extending between the first region and the second region in the thickness direction, and being connected to the first conductive portion and the second conductive portion.

The method includes the first etching treatment and the second etching treatment as described above to form the via portion in the metal core layer of the double-sided wiring circuit board having the first conductive layer at one side in the thickness direction and the second conductive layer at the other side, where the via portion connects the first conductive layer and the second conductive layer and is surrounded by the space. This method does not require an insulating film or the like for insulating the via portion from the other part in the metal core layer. This method is suitable for reducing the number of the steps of forming the via portion, which electrically connects the first and second conductive layers, in the manufacturing process of the double-sided wiring circuit board having the metal core layer. This method is also suitable to carry out the etching for forming an outer edge, outer edge in projective view, of the metal core layer in the first and second etching treatments. This aspect of the method is also suitable for reducing the number of the steps. The method suitable for reducing the number of the steps as described above is suitable to efficiently manufacture the double-sided wiring circuit board having the metal core layer. Further, according to the method, the formation of the space in the metal core layer constructs, or forms, the conductive structure or via portion, which electrically connects the circuits on both the surfaces. This allows for an appropriate electrical connection between the circuits on both the surfaces even when the circuit board has a thick metal core layer.

The present invention [2] includes the method described in [1], wherein the first etching treatment and the second etching treatment are simultaneously carried out.

Such a configuration is suitable fir reducing the steps of the manufacturing method of the double-sided wiring circuit board having the metal core layer, and thus suitable to efficiently manufacture the double-sided wiring circuit board having the metal core layer.

The present invention [3] includes the method described in [1] or [2], wherein, in a projective view in the thickness direction, the first opening and the second opening are connected to each other, and surround the first conductive portion and the second conductive portion.

The first opening and the second opening overlap or are connected to each other and surround the first conductive portion and the second conductive portion in the projective view. Such a structure is suitable to form the space around the via portion in the metal core layer by the first etching treatment for etching the metal core layer through the first opening and the second etching treatment through the second opening.

The present invention [4] includes the method described in any one of [1] to [3], wherein the laminate further including a third insulating layer covering the first conductor layer at the one side in the thickness direction of the first insulating layer, and having a third opening communicating with the first opening; and a fourth insulating layer covering the second conductor layer at the other side in the thickness direction of the second insulating layer, and having a fourth opening communicating with the second opening.

The above-described structure is suitable to carry out the first and second etching treatments without an additional preparation of etching masks for covering and protecting the first conductive layer and the second conductive layer, and thus suitable for reducing the number of the steps.

The present invention [5] includes a double-sided wiring circuit board including: a metal core layer including a via portion surrounded by a space, and a core layer principal portion adjacent to the via portion through the space; a first insulating layer disposed at one side in a thickness direction of the metal core layer, and having a first region and at least one first opening adjacent to the first region, the first region having a first hole; a first conductor layer having a first wiring portion and a first conductive portion, the first wiring portion being disposed at least on the first region at one side in the thickness direction of the first insulating layer, the first conductive portion being disposed in the first hole and connected to the first wiring portion and the metal core layer; a second insulating layer disposed at the other side in the thickness direction of the metal core layer, and having a second region and at least one second opening adjacent to the second region, the second region including a part facing to the first region in the thickness direction, the second region having a second hole in the facing part; and a second conductor layer having a second wiring portion and a second conductive portion, the second wiring portion being disposed at least on the second region at the other side in the thickness direction of the second insulating layer, the second conductive portion being disposed in the second hole and connected to the second wiring portion and the metal core layer.

The double-sided wiring circuit board having the above-described structure is suitable for reducing the number of the steps of the manufacturing process and thus suitable for efficient circuit board manufacture.

The present invention [6] includes the double-sided wiring circuit board described in [5], wherein, in a projective view in the thickness direction, the first opening and the second opening are connected to each other, and surround the first conductive portion and the second conductive portion.

As described above, the first opening and the second opening are connected or overlap each other and surround the first conductive portion and the second conductive portion in the projective view. Such a structure is suitable to form the space around the via portion in the metal core layer by the first etching treatment for etching the metal core layer through the first opening and the second etching treatment through the second opening in the manufacturing process of the double-sided wiring circuit board.

BRIEF DESCRIPTION OF THE DRAWINGS

FIG. 8 illustrates the shapes of a first opening, a second opening, a first conductive portion, and a second conductive portion when the double-sided wiring circuit board shown in FIG. 6 and FIG. 7 is projected in a thickness direction FIG. 9 is a cross-sectional view of another variation of the double-sided wiring circuit board illustrated in FIG. 1.

FIG. 11 illustrates some steps of the method for manufacturing the double-sided wiring circuit board of the first embodiment as the changes in the cross section corresponding to FIG. 1.

FIG. 12 illustrates the steps subsequent to the steps of FIG. 11.

FIG. 13 illustrates some steps of the method for manufacturing the double-sided wiring circuit board of the first embodiment as the changes in the cross section corresponding to FIG. 4.

FIG. 14 illustrates the steps subsequent to the steps of FIG. 13.

FIG. 15 illustrates a laminate that is an intermediate product in a variation of the method for manufacturing the double-sided wiring circuit board of the first embodiment.

FIG. 17 illustrates the etching step of the variation of the method for manufacturing the double-sided wiring circuit board of the first embodiment.

FIG. 23 illustrates some steps of the method for manufacturing the double-sided wiring circuit board of the second embodiment as the changes in the cross section corresponding to FIG. 18.

FIG. 24 illustrates the steps subsequent to the steps of FIG. 23.

FIG. 25 illustrates some steps of the method for manufacturing the double-sided wiring circuit board of the second embodiment as the changes in the cross section corresponding to FIG. 21.

FIG. 26 illustrates the steps subsequent to the steps of FIG. 25.

FIG. 27 illustrates an intermediate laminate used in a variation of the method for manufacturing the double-sided wiring circuit board of the second embodiment.

DESCRIPTION OF THE EMBODIMENTS

Figure 1:
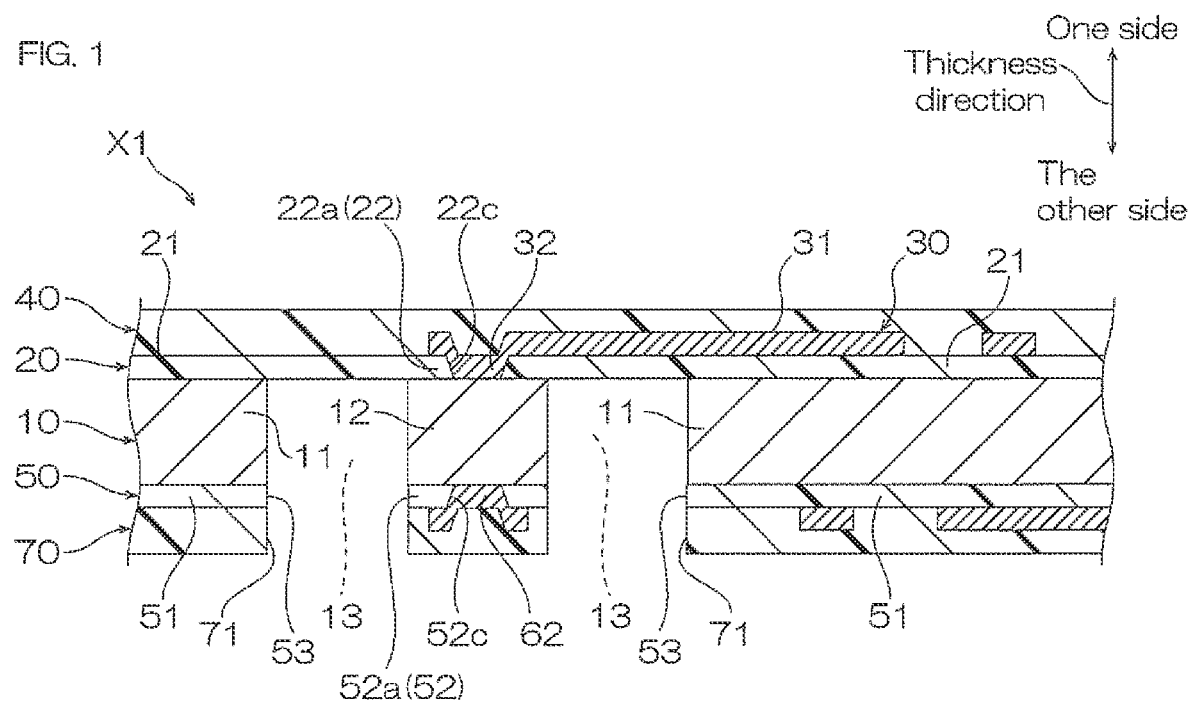
FIG. 1 is a cross-sectional view of the first embodiment of a double-sided wiring circuit board of the present invention.
Figure 2:
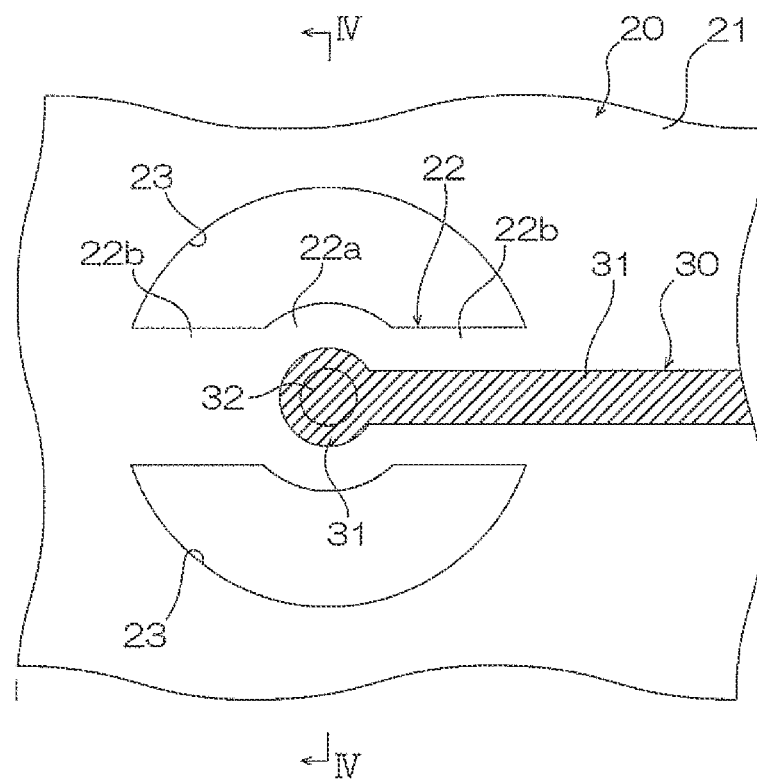
FIG. 2 is a partial top view of the double-sided wiring circuit board illustrated in FIG. 1.
Figure 3:
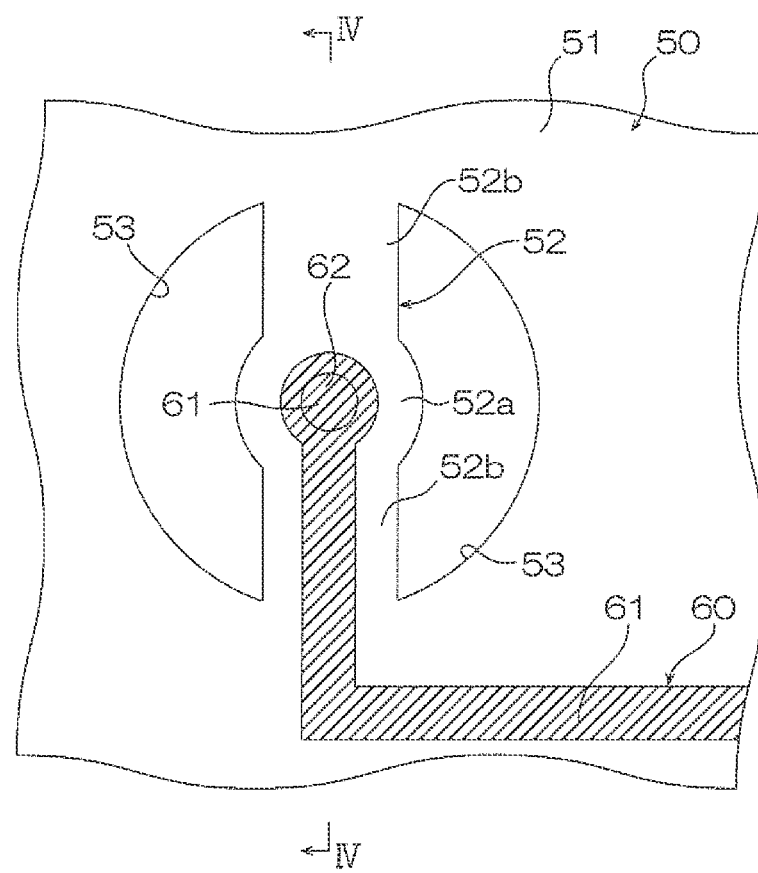
FIG. 3 is a partial bottom view of the double-sided wiring circuit board illustrated in FIG. 1.
Figure 4:
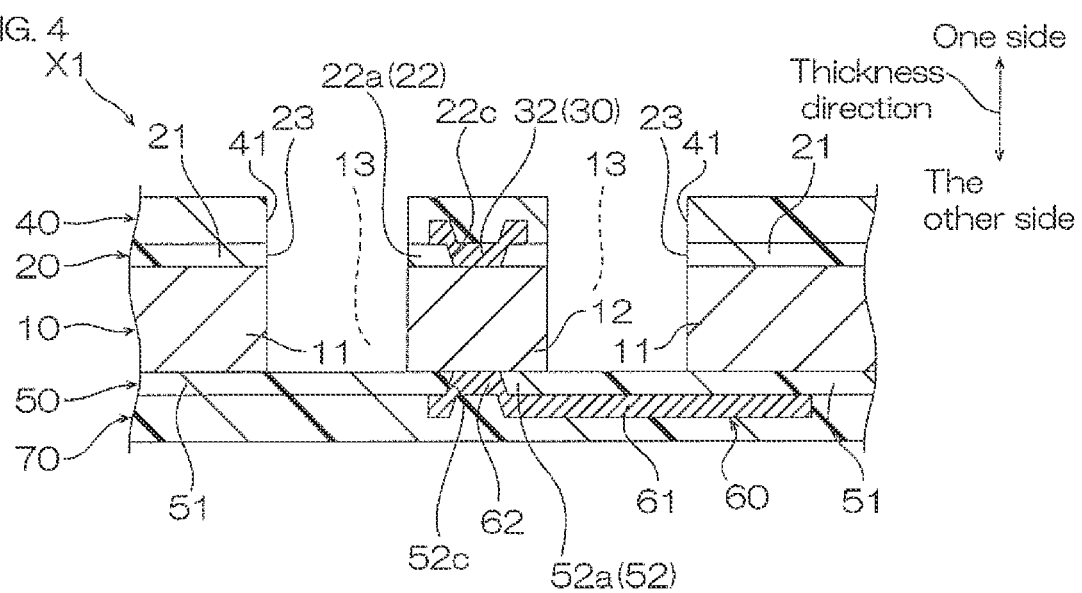
FIG. 4 is a cross-sectional view taken along line IV-IV of FIG. 2 and FIG. 3.

FIG. 1 to FIG. 4 illustrate a wiring circuit board X1 of the first embodiment of the present invention. FIG. 1 is a schematic cross-sectional view of the wiring circuit board X1. FIG. 2 is a partial top view of the wiring circuit board X1. In this figure, an insulating layer 40 described below is omitted. FIG. 3 is a partial bottom view of the wiring circuit board X1. In this figure, an insulating layer 70 described below is omitted. FIG. 4 is a cross-sectional view taken along line IV-IV of FIG. 2 and FIG. 3.

The wiring circuit board X1 is a double-sided wiring circuit board, and includes a metal core layer 10, insulating layers 20, 40, 50, and 70, and conductive layers 30 and 60.

As illustrated in FIG. 1, the metal core layer 10 has a core layer principal portion 11 and a via portion 12. The core layer principal portion 11 is an element to secure the stiffness of the wiring circuit board X1. The via portion 12 is an element to electrically connect the circuits on both surfaces of the wiring circuit board X1. The via portion 12 has a periphery surrounded by the space 13 as illustrated in FIG. 1 and FIG. 4. The via portion 12 and the core layer principal portion 11 are adjacent to each other through the space 13. Specifically, the core layer principal portion 11 has a board shape, and the space 13, which has a cylindrical shape, is formed in the core layer principal portion 11. The via portion 12, which has a column shape, is disposed within the space 13 while being separated from the core layer principal portion 11 by an interval. The separation distance between the via portion 12 and the core layer principal portion 11 is, for example, 10 µm or more, preferably 15 µm or more. The space 13 insulates the via portion 12 from the core layer principal portion 11 by surrounding the via portion 12 as described above.

Examples of a constitute material of the metal core layer 10 include Cu, Cu alloys, stainless steels, and 42 alloys. For thermal conductivity and electrical conductivity, Cu and a Cu alloy are preferred.

The metal core layer 10 has a thickness of, for example, 10 µm or more, preferably 15 µm or more, and, for example, 500 µm or less, preferably 300 µm or less.

As illustrated in FIG. 1 and FIG. 4, the insulatine layer 20, i.e., the first insulating layer is an insulating base layer disposed at one side in the thickness direction of the metal core layer 10. The insulating layer 20 has a pattern shape including a principal portion 21, a region 22, i.e., the first region, and a plurality of openings 23, i.e., the first openings adjacent to the region 22 and interposed between the principal portion 21 and the region 22. The present embodiment demonstrates that one region 22 is provided with two openings 23.

The principal portion 21 overlaps the core layer principal portion 11 in the projection in the thickness direction, on the assumption that they are projected in the thickness direction. Hereinafter, such an assumed projection in the thickness direction may merely be referred to as "the projective view".

The region 22 has an inside part 22a and a plurality of coupling parts 22b.

In the projective view, the inside part 22a overlaps the via portion 12 and is in contact with one end in the thickness direction of the via portion 12. The inside part 22a of the present embodiment has a circular shape. The region 22 has a hole 22c in the inside part 22a. At a central portion of the inside part 22a in the projective view, the hole 22c penetrates the inside part 22a in the thickness direction.

The coupling parts 22b couple the inside part 22a with the principal portion 21. The coupling parts 22b overlap openings 53 described below and do not overlap coupling parts 52b described below in the projective view. A plurality of the coupling parts 22b is disposed while holding the inside part 22a therebetween. The present embodiment demonstrates that one region 22 is provided with two coupling pans 22b.

Each of the coupling parts 22b has a strip shape having one end coupled with the inside part 22a and the other end coupled with the principal portion 21.

The openings 23 function as etching windows in the etching step of etching the metal core layer 10 in the following process of manufacturing the wiring circuit board X1, and penetrate the insulating layer 20 in the thickness direction. The embodiment demonstrates that two openings 23 hold the region 22 therebetween. The embodiment further demonstrates that, as illustrated in FIG. 2, each of the openings 23 has a sector shape, and the region 22 and the two openings 23 form an approximately circular shape in the projective view.

Examples of a constitute material of the insulating layer 20 include synthetic resins, such as polyimide, polyether nitrile, polyether sulfone, polyethylene terephthalate, polyethylene naphthalate, and polyvinyl chloride. A photosensitive polyimide is preferably used. The same applies to the constitute materials of the insulating layers 40, 50, and 70 that are described below.

The insulating layer 20 has a thickness of, for example, 1 μm or more, preferably 3 μm or more, and, for example, 35 μm or less, preferably 20 μm or less.

As illustrated in FIG. 1 and FIG. 4, the conductive layer 30, i.e., the first conductive layer includes a wiring portion 31, i.e., the first wiring portion and a conductive portion 32, i.e., the first conductive portion. The wiring portion 31 is disposed at one side in the thickness direction of the insulating layer 20, and has a predetermined pattern shape. The wiring portion 31 of the present embodiment is disposed over the principal portion 21 and region 22 of the insulating layer 20. Specifically, as illustrated in FIG. 2, the wiring portion 31 has one end disposed on the inside part 22a, passes through one of the coupling parts 22b, and extends to the outside of the region 22. The conductive portion 32 is disposed in the hole 22c of the insulating layer 20, connected to the wiring portion 31, and also connected to one end in the thickness direction of the via portion 12 of the metal core layer 10.

Examples of a constitute material of the conductive layer 30 include metal materials, such as copper, nickel, gold, solder, and alloys thereof. Copper is preferred. The same applies to the constitute material of a conductive layer 60 that is described below.

The conductive layer 30 has a thickness of, for example, 3 μm or more, preferably 5 μm or more, and, for example, 50 μm or less, preferably 30 μm or less.

The insulating layer 40, i.e., the third insulating layer is an insulating cover layer that is disposed at one side in the thickness direction of the insulating layer 20 to cover the conductive layer 30, and has a pattern shape having openings 41 that are the third openings. The openings 41 overlap the openings 23 of the insulating layer 20 and are communicated with the openings 23 in the projective view. The openings 41 of the present embodiment have opening shapes identical or substantially identical to the openings 23. The openings 41 can function as etching windows in the etching step of etching the metal core layer 10 of the following process of manufacturing the wiring circuit board X1.

As long as the insulating layer 40 has a greater thickness or height from the insulating layer 20 than that of the conductive layer 30, the thickness of the insulating layer 40 is, for example, 4 μm or more, preferably 6 μm or more, and, for example, 60 μm or less, preferably 40 μm or less.

As illustrated in FIG. 1 and FIG. 4, the insulating layer 50, i.e., the second insulating layer is an insulating base layer disposed at the other side in the thickness direction of the metal core layer 10. The insulating layer 50 has a pattern shape including a principal portion 51, a region 52, i.e., the second region, and a plurality of openings 53, i.e., the second openings adjacent to the region 52 and interposed between the principal portion 51 and the region 52. The present embodiment demonstrates that one region 52 is provided with two openings 53.

The principal portion 51 overlaps the core layer principal portion 11 in the projective view.

The region 52 includes an inside part 52a and a plurality of coupling parts 52b.

The inside part 52a overlaps the via portion 12 and is in contact with the other end in the thickness direction of the via portion 12 in the projective view. The inside part 52a of the present embodiment has a circular shape. The inside part 52a faces to the inside part 22a of the region 22 in the thickness direction. The region 52 has a hole 52c in the inside part 52a. At a central portion of the inside part 52a in the projective view, the hole 52c penetrates the inside part 52a in the thickness direction.

The coupling parts 52b couple the inside part 52a with the principal portion 51. The coupling parts 52b overlap the openings 23 and do not overlap the coupling parts 22b in the projective view. A plurality of the coupling parts 52b holds the inside part 52a therebetween. The present embodiment demonstrates that one region 52 is provided with two coupling parts 52b. Each of the coupling parts 52b has a strip shape having one end coupled with the inside part 52a and the other end coupled with the principal portion 51. The direction in which the coupling parts 52b extend intersects with the direction in which the coupling parts 22b extend in the projective view. The present embodiment demonstrates that the directions are orthogonal to each other in the projective view.

The openings 53 function as etching windows in the etching step of etching the metal core layer 10 in the following process of manufacturing the wiring circuit board X1, and penetrate the insulating layer 50 in the thickness direction. The present embodiment demonstrates that two openings 53 hold the region 52 therebetween. The present embodiment further demonstrates that, as illustrated in FIG. 3, each of the openings 53 has a sector shape, and the region 52 and the two openings 53 form an approximately circular shape in the projective view.

The insulating layer 50 has a thickness of, for example, 1 μm or more, preferably 3 μm or more, and, for example, 35 μm or less, preferably 20 μm or less.

As illustrated in FIG. 1 and FIG. 4, the conductive layer 60, i.e., the second conductive layer includes a wiring portion 61, i.e., the second wiring portion and a conductive portion 62, i.e., the second conductive portion. The wiring portion 61 is disposed at the other side in the thickness direction of the insulating layer 50, and has a predetermined pattern shape. The wiring portion 61 of the present embodiment is disposed over the principal portion 51 and region 52 of the insulating layer 50. Specifically, as illustrated in FIG. 3, the wiring portion 61 has one end disposed on the inside part 52a, passes through one of the coupling parts 52b, and extends to the outside of the region 52. The conductive portion 62 is disposed in the hole 52c of the insulating layer 50, connected to the wiring portion 61, and also connected to the other end in the thickness direction of the via portion 12 of the metal core layer 10.

The conductive layer 60 has a thickness of, for example, 3 μm or more, preferably 5 μm or more, and, for example, 50 μm or less, preferably 30 μm or less.

The insulating layer 70, i.e., the fourth insulating layer is an insulating cover layer that is disposed at the other side in the thickness direction of the insulating layer 50 to cover the conductive layer 60, and has a pattern shape having openings 71, i.e., the fourth openings. The openings 71 overlap the openings 53 of the insulating layer 50 and are communicated with the openings 53 in the projective view. The openings 71 of the present embodiment have opening shapes identical or substantially identical to the openings 53. The openings 71 can function as etching windows in the etching step of etching the metal core layer 10 in the following process of manufacturing the wiring circuit board X1.

As long as the insulating layer 70 has a greater thickness or height from the insulating layer 50 than that of the conductive layer 60, the thickness of the insulating layer 70 is, for example, 4 µm or more, preferably 6 µm or more, and, for example, 60 µm or less, preferably 40 µm or less.

Figure 5:
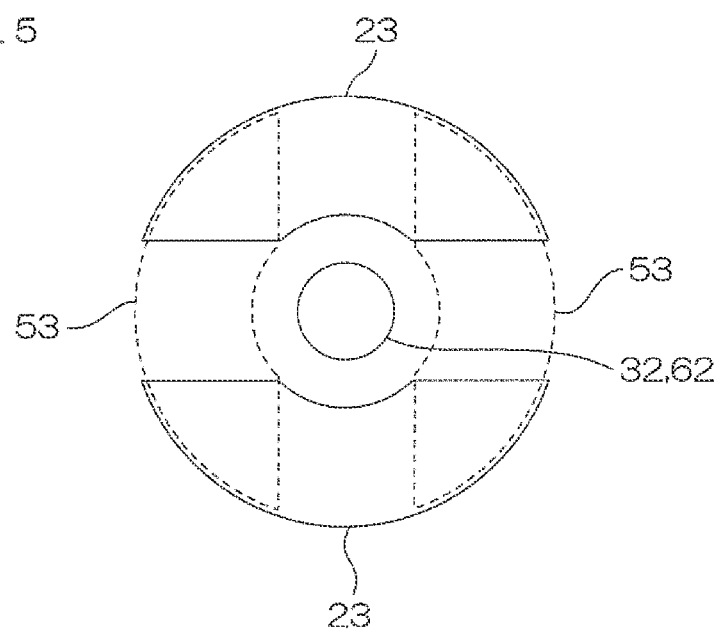
FIG. 5 illustrates the shapes of a first opening, a second opening, a first conductive portion, and a second conductive portion when the double-sided wiring circuit board shown in FIG. 1 is projected in a thickness direction.

In the projective view in the thickness direction of the wiring circuit board X1 as illustrated in FIG. 5, the openings 23 of the insulating layer 20 and the openings 53 of the insulating layer 50 are connected to or overlap each other and surround the conductive portions 32 and 62. FIG. 5 illustrates the shapes of the openings 53 with the phantom lines and the shapes of the openings 23 and the conductive portions 32 and 62 with the solid lines. The openings 23 and 53 of the present embodiment are connected to or overlap and form a circular shape in the projective view. In the projective view in the thickness direction of the wiring circuit board X1, the openings 23 and the openings 53 are connected to or overlap each other and surround the via portion 12. The openings 23 and 53 of the present embodiment form an opening shape. As described above, the openings 41 of the insulating layer 40 have opening shapes identical or substantially identical to the openings 23, and the openings 71 of the insulating layer 70 have opening shapes identical or substantially identical to the openings 53.

Figure 6:
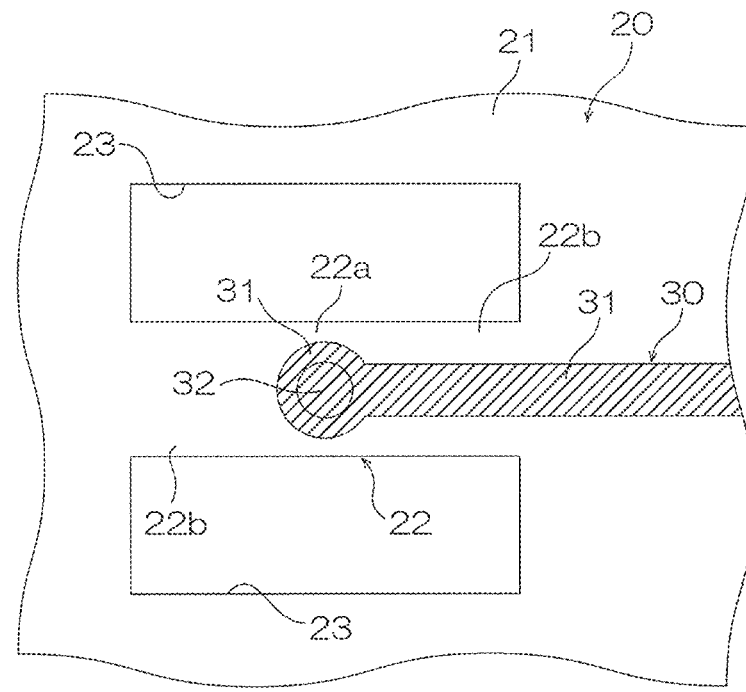
FIG. 6 is a partial top view of a variation of the double-sided wiring circuit board illustrated in FIG. 1.
Figure 7:
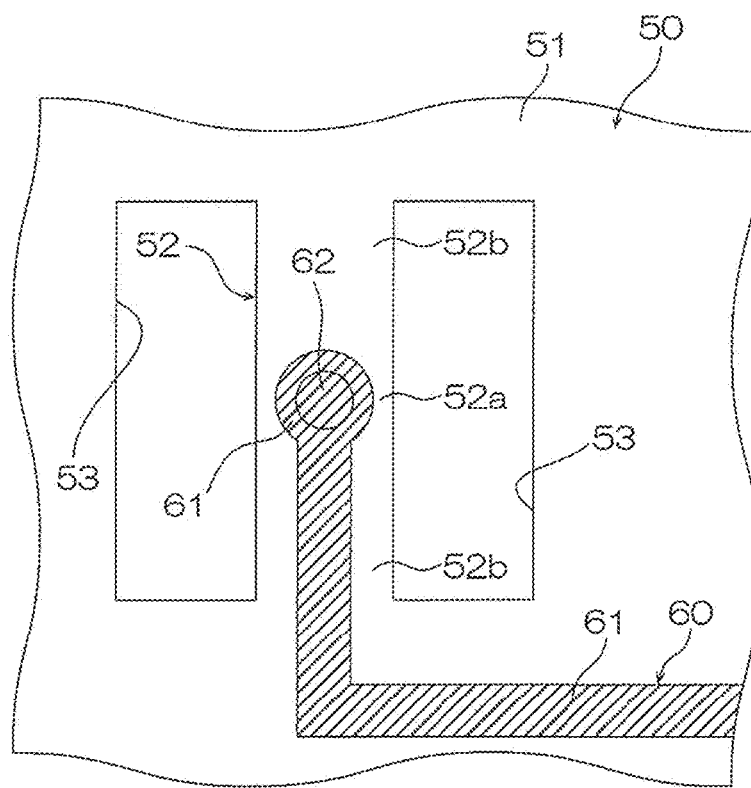
FIG. 7 is a partial bottom view of the variation of the double-sided wiring circuit board illustrated in FIG. 1.

In the wiring circuit board X1, the insulating layer 20 may have a pattern shape including the region 22 and openings 23 in the shapes in the projective view as illustrated in FIG. 6, and the insulating layer 50 may have a pattern shape including the region 52 and openings 53 in the shapes in the projective view as illustrated in FIG. 7, where the region 52 includes a part facing the region 22 in the thickness direction. The openings 41 of the insulating layer 40 have opening shapes identical or substantially identical to the openings 23 and are omitted in FIG. 6. The openings 71 of the insulating layer 70 have opening shapes identical or substantially identical to the openings 53 and are omitted in FIG. 7. The present variation demonstrates that the inside part 22a and the coupling parts 22b form an approximately rectangular shape in the region 22. The openings 23 each have an approximately rectangular shape while holding the region 22 therebetween. The region 22 and the two openings 23 form an approximately rectangular shape in the projective view. Similarly, the present variation demonstrates that the inside part 52a and the coupling parts 52b form an approximately rectangular shape in the region 52. The openings 53 each have an approximately rectangular shape while holding the region 52 therebetween. The region 52 and the two openings 53 form an approximately rectangular shape in the projective view. In the projective view in the thickness direction of the present variation as illustrated in FIG. 8, the openings 23 of the insulating layer 20 and the openings 53 of the insulating layer 50 overlap and form a rectangular frame shape, and surround the conductive portions 32 and 62. In the projective view in the thickness direction of the wiring circuit board X1, the openings 23 of the insulating layer 20 and the openings 53 of the insulating layer 50 are connected or overlap each other and surround the via portion 12.

For example, as illustrated in FIG. 9, the conductive portion 32 of the conductive layer 30 and the conductive portion 62 of the conductive layer 60 may be displaced from each other in a surface direction orthogonal to the thickness direction in the wiring circuit board X1. Such a structure can also achieve the electrical connection between the conductive layers 30 and 60 by the via portion 12.

Figure 10A:
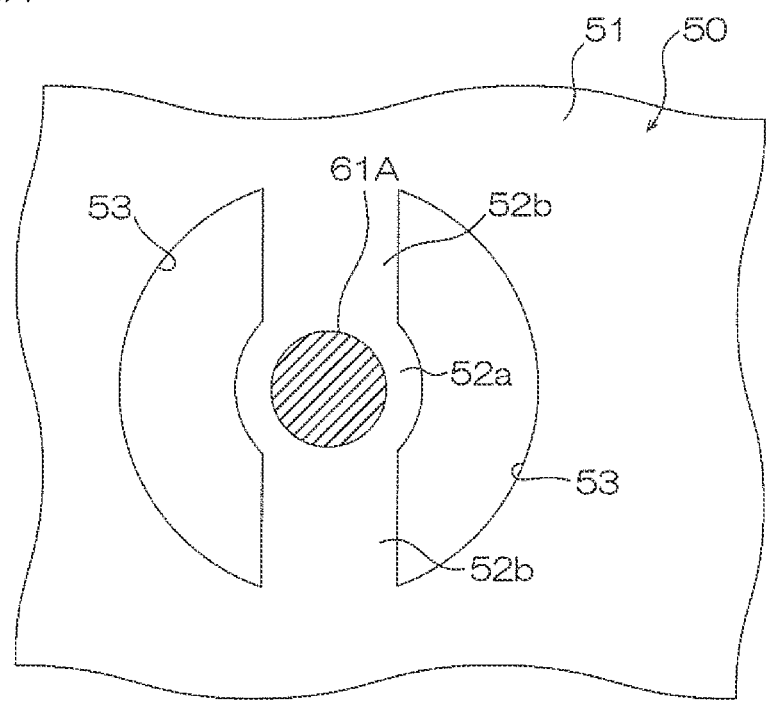
FIG. 10A is a partial top view of the variation shown in FIG. 9 of the double-sided wiring circuit board illustrated in FIG. 1.
Figure 10B:
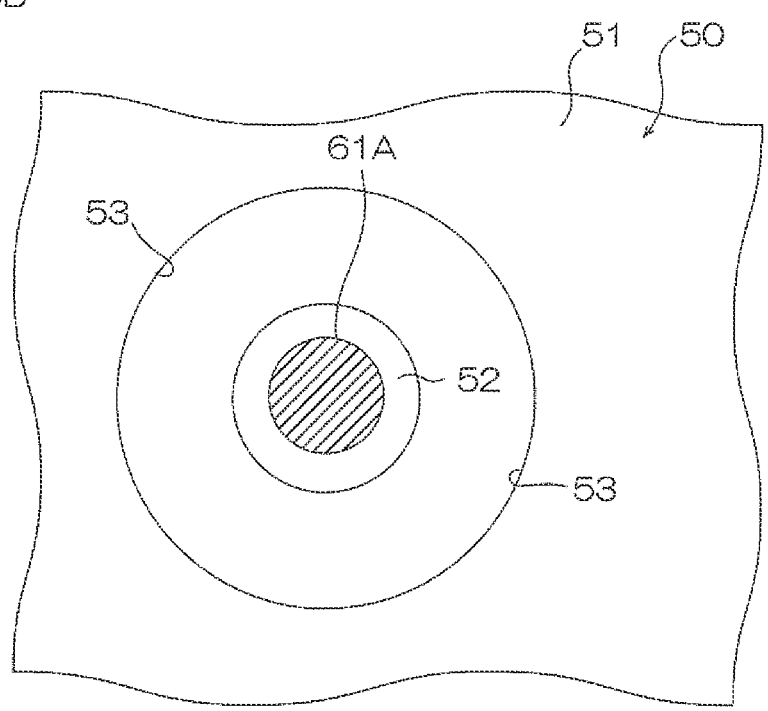
FIG. 10B is a partial bottom view of a lower part of the variation shown in FIG. 9 of the double-sided wiring circuit board illustrated in FIG. 1.

One of the wiring portion 31 and the wiring portion 61 may be an electrode pad in the wiring circuit board X1, where the conductive portion 32 of the conductive layer 30 is connected to the wiring portion 31 and the conductive portion 62 of the conductive layer 60 is connected to the wiring portion 61. When the wiring portion 31 to which the conductive portion 32 of the conductive layer 30 is connected is an electrode pad, the insulating layer 40 is provided with a predetermined opening that exposes the electrode pad to the outside. When the wiring portion 61 to which the conductive portion 62 of the conductive layer 60 is connected is an electrode pad, the insulating layer 70 is provided with a predetermined opening that exposes the electrode pad to the outside. FIG. 10A and FIG. 10B each illustrate an example in which the wiring portion 61 to which the conductive portion 62 of the conductive layer 60 is connected is an electrode pad 61A, although not illustrating the insulating layer 70. The variation of FIG. 10B demonstrates that the region 52 is separated from the principal portion 51 in the insulating layer 50.

FIG. 11 to FIG. 14 illustrate a method of manufacturing the wiring circuit board X1. FIG. 11 and FIG. 12 illustrate the manufacturing method as the changes in the cross section corresponding to FIG. 1. FIG. 13 and FIG. 14 illustrate the manufacturing method as the changes in the cross section corresponding to FIG. 4.

Figure 11A:
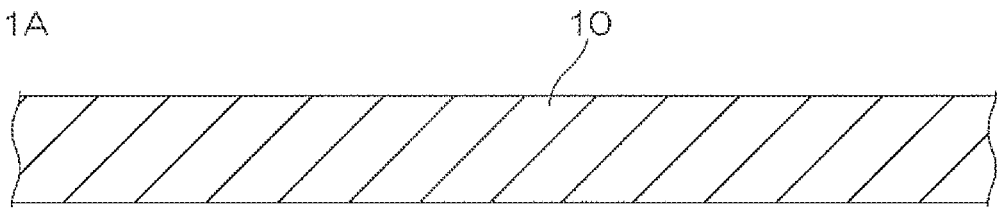
FIG. 11A illustrates a preparation step.
Figure 13A:
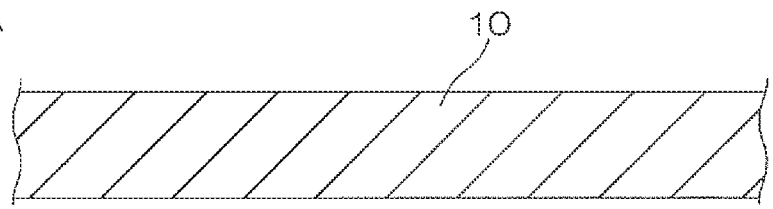
FIG. 13A illustrates a preparation step.

In the present manufacturing method, the metal core layer 10 is prepared first as illustrated in FIG. 11A and FIG. 13A (preparation step).

Figure 11B:
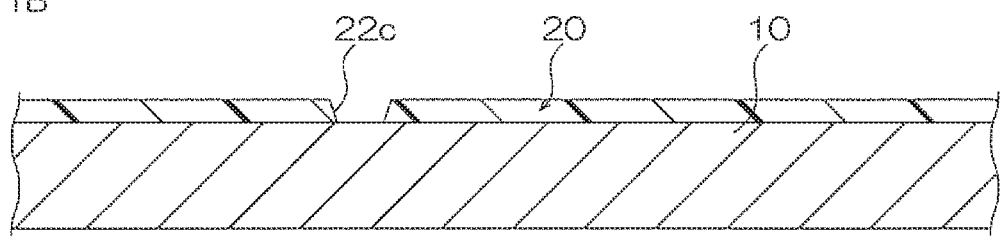
FIG. 11B illustrates a step of forming a first insulating base layer.
Figure 13B:
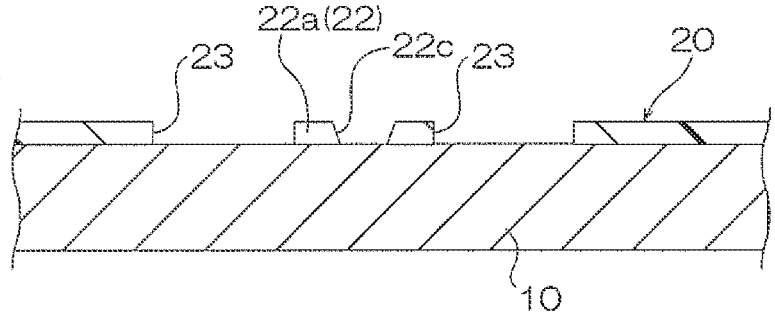
FIG. 13B illustrates a step of forming a first insulating base layer.

Next, as illustrated in FIG. 11B and FIG. 13B, the insulating layer 20, i.e., an insulating base layer is formed on the metal core layer 10 (first insulating base layer formation step). In this step, the insulating layer 20 is formed as exemplified follows. A solution or varnish containing a photosensitive resin for forming the insulating layer 20 is applied on one surface in the thickness direction of the metal core layer 10 and dried to form an insulating film. Next, the formed insulating film is patterned. Specifically, the insulating film is subjected to an exposure process through a predetermined mask, and a development process following the exposure. As necessary, a baking process follows the development. As exemplified above, the insulating layer 20, which has a predetermined pattern including the hole 22c and openings 23 from which the metal core layer 10 is partially exposed, is formed on the metal core layer 10.

Figure 11C:
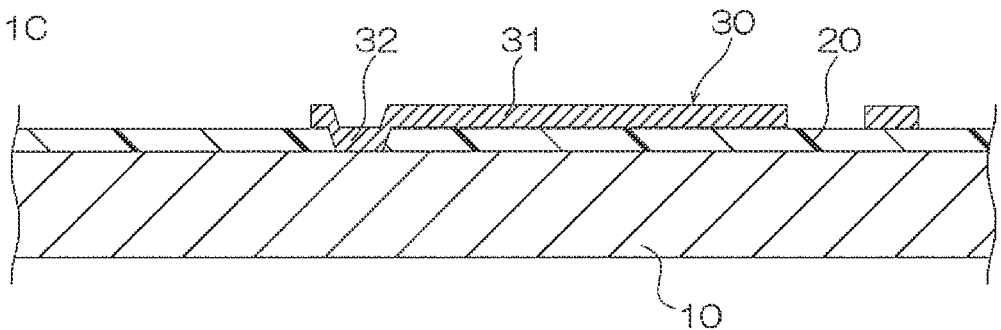
FIG. 11C illustrates a step of forming a first conductive layer.
Figure 13C:
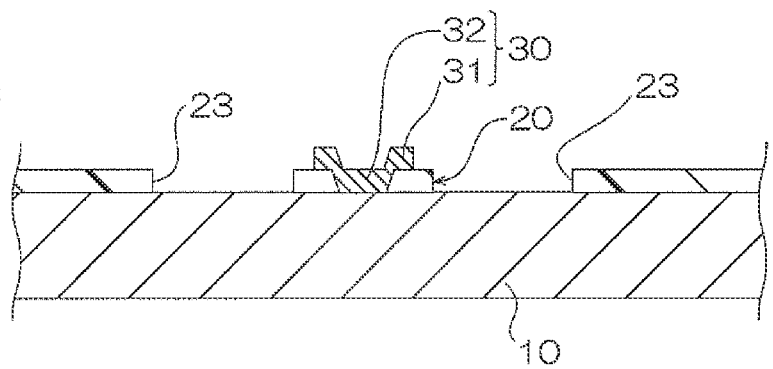
FIG. 13C illustrates a step of forming a first conductive layer.

Next, as illustrated in FIG. 11C and FIG. 13C, the conductive layer 30 is formed on the insulating layer 20 (first conductive layer formation step). In this step, the conductive layer 30 is formed as exemplified follows. First, a thin seed layer, not illustrated, is formed on one surface in the thickness direction of the insulating layer 20 and the one surface in the thickness direction of the metal core layer 10 that is not covered with the insulating layer 20, for example, by a sputtering method. The seed layer is a conductive layer for forming an electrolytic plating film and. Examples of a constitute material of the seed layer include copper, chromium, nickel, and alloys thereof. Next, a resist pattern is formed on the seed layer. The resist pattern has an opening corresponding to the pattern shape of the conductive layer 30. For the formation of the resist pattern, for example, a photosensitive resist film is bonded to the seed layer to form a resist film, and the formed resist film is subjected to an exposure process through a predetermined mask, and a development following the exposure. As necessary, a baking process follows the development. For the formation of the conductive layer 30, next, an electrolytic plating method is carried out to deposit a metal material on the seed layer in a region of the opening of the resist pattern. Copper is preferably used as the metal material. Next, the resist pattern is removed by etching. Next, the part of the seed layer exposed by the removal of the resist pattern is removed by etching. As exemplified above, a conductive layer 30 having a predetermined pattern including the wiring portion 31 and conductive portion 32 is formed.

Figure 11D:
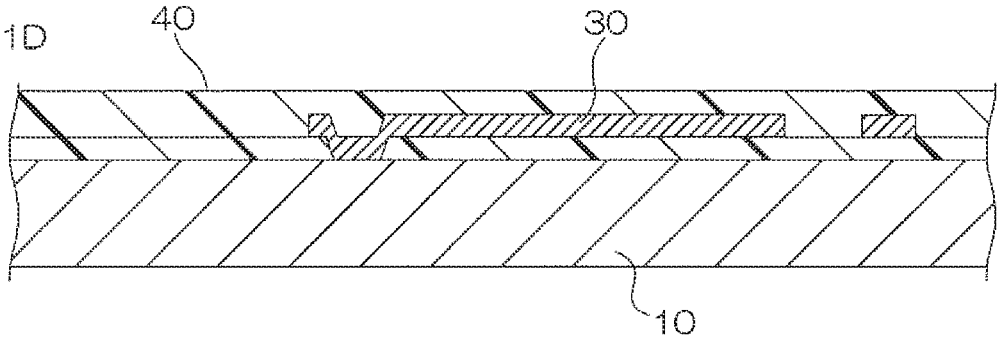
FIG. 11D illustrates a step of forming a first insulating cover layer.
Figure 13D:
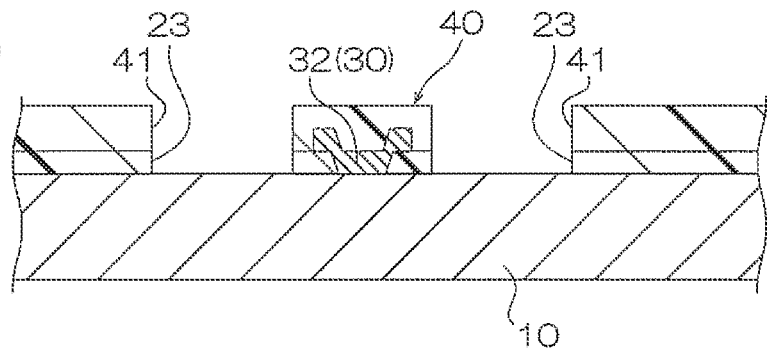
FIG. 13D illustrates a step of forming a first insulating cover layer.

In the present manufacturing method, next, as illustrated in FIG. 11D and FIG. 13D, the insulating layer 40, i.e., an insulating cover layer is formed at one side in the thickness direction of the insulating layer 20 to cover the conductive layer 30 (first insulating cover layer formation step). In this step, the insulating layer 40 is formed as exemplified follows. A solution or varnish containing a photosensitive resin for forming the insulating layer 40 is applied on one surface in the thickness direction of the insulating layer 20 and one surface in the thickness direction of the conductive layer 30 and dried to form an insulating film. Next, the formed insulating film is patterned. Specifically, the insulating film is subjected to an exposure process through a predetermined mask, and a development process following the exposure. As necessary, a baking process follows the development. As exemplified above, the insulating layer 40 having a predetermined pattern including the opening 41 is formed.

Figure 12A:
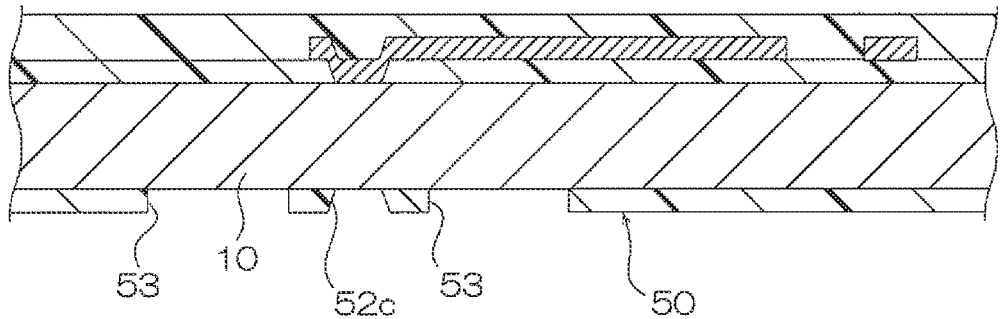
FIG. 12A illustrates a step of forming a second insulating base layer.
Figure 14A:
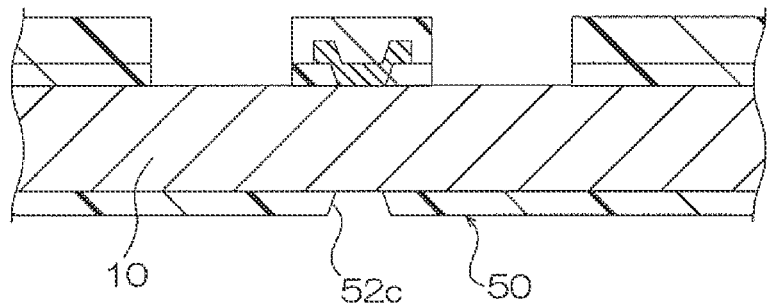
FIG. 14A illustrates a step of forming a second insulating base layer.

Next, as illustrated in FIG. 12A and FIG. 14A, the insulating layer 50, i.e., an insulating base layer is formed on the metal core layer 10 (second insulating base layer formation step). In this step, for example, the insulating layer 50 is formed as follows. First, a solution or varnish containing a photosensitive resin for forming the insulating layer 50 is applied on the other surface in the thickness direction of the metal core layer 10 and dried to form an insulating film. Next, the formed insulating film is patterned. Specifically, the insulating film is subjected to an exposure process through a predetermined mask, and a development process following the exposure. As necessary, a baking process follows the development. As exemplified above, the insulating layer 50, which has a predetermined pattern including the hole 52c and openings 53 from which the metal core layer 10 is partially exposed, is formed on the other surface in the thickness direction of the metal core layer 10.

Figure 12B:
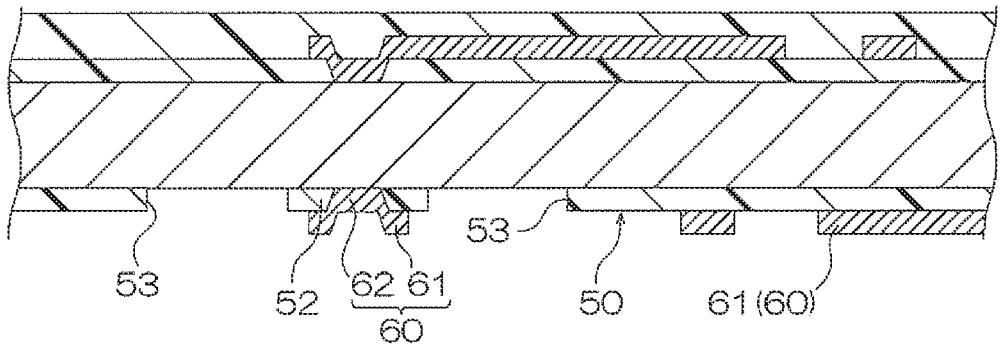
FIG. 12B illustrates a step of forming a second conductive layer.
Figure 14B:
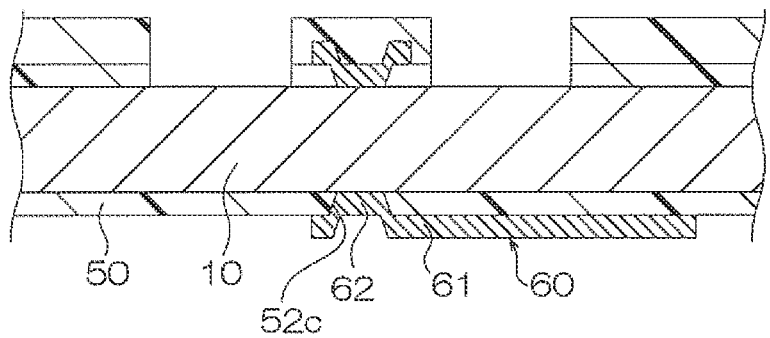
FIG. 14B illustrates a step of forming a second conductive layer.

Next, as illustrated in FIG. 12B and FIG. 14B, the conductive layer 60 is formed on the insulating layer 50 (second conductive layer formation step). In this step, the conductive layer 60 is formed as exemplified follows. First, a thin seed layer, not illustrated, is formed on the other surface in the thickness direction of the insulating layer 50 and the one surface in the thickness direction of the metal core layer 10 that is not covered with the insulating layer 50, for example, by a sputtering method. The seed layer is a conductive layer for forming an electrolytic plating film. Next, a resist pattern is formed on the seed layer. The resist pattern has an opening corresponding to the pattern shape of the conductive layer 60. For the formation of the resist pattern, for example, a photosensitive resist film is bonded to the seed layer to form a resist film, and the formed resist film is subjected to an exposure process through a predetermined mask, and a development following the exposure. As necessary, a baking process follows the development. For the formation of the conductive layer 60, next, an electrolytic plating method is carried out to deposit a metal material on the seed layer in a region of the opening of the resist pattern. Copper is preferably used as the metal material. Next, the resist pattern is removed by etching. Next, the part of the seed layer exposed by the removal of the resist pattern is removed by etching. As exemplified above, a conductive layer 60 having a predetermined pattern including the wiring portion 61 and conductive portion 62 can be formed.

Figure 12C:
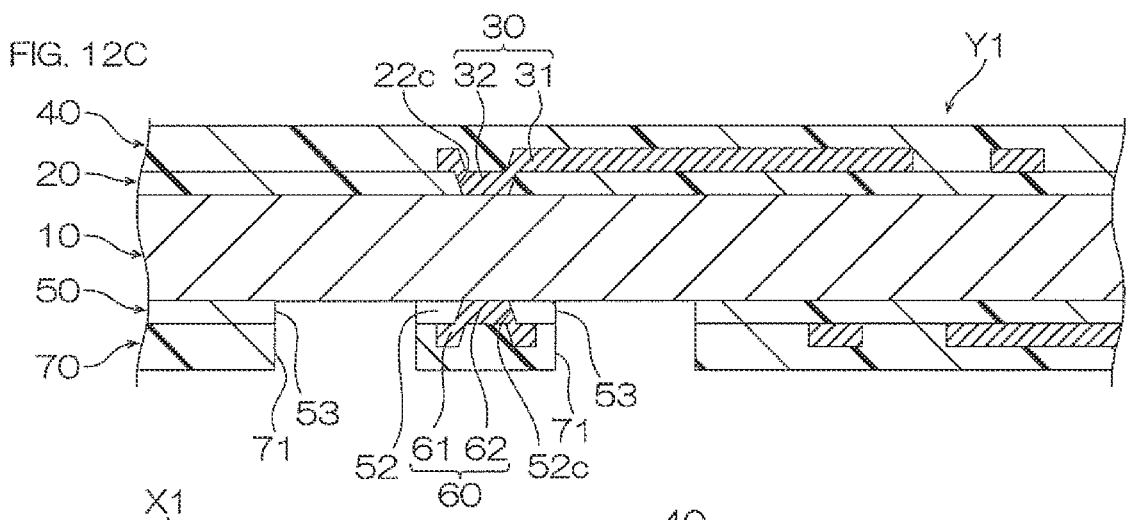
FIG. 12C illustrates a step of forming a second insulating cover layer.
Figure 14C:
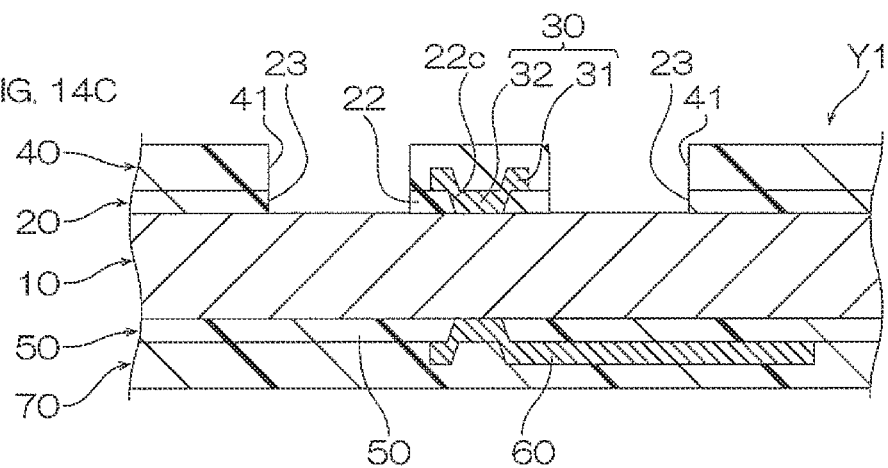
FIG. 14C illustrates a step of forming a second insulating cover layer.

In the present manufacturing method, next, as illustrated in FIG. 12C and FIG. 14C, the insulating layer 70, i.e., an insulating cover layer is formed at the other side in the thickness direction of the insulating layer 50 to cover the conductive layer 60 (second insulating cover layer formation step). In this step, the insulating layer 70 is formed as exemplified follows. First, a solution or varnish containing a photosensitive resin for forming the insulating layer 70 is applied on the other surface in the thickness direction of the insulating layer 50 and the other surface in the thickness direction of the conductive layer 60 and dried to form an insulating film. Next, the formed insulating film is patterned. Specifically, the insulating film is subjected to an exposure process through a predetermined mask, and a development process following the exposure. As necessary, a baking process follows the development. As exemplified above, the insulating layer 70 having a predetermined pattern including the opening 71 is formed.

The present embodiment demonstrates that the above-described steps are carried out to manufacture a laminate Y1 that is an intermediate product. The laminate Y1 includes a metal core layer 10, an insulating layer 20, a conductive layer 30, an insulating layer 40, an insulating layer 50, a conductive layer 60, and an insulating layer 70, where the above-described core layer principal portion 11 and via portion 12 are yet to be formed on the metal core layer 10, the insulating layer 20, conductive layer 30, and insulating layer 40 are disposed at one side in the thickness direction of the metal core layer 10, and the insulating layer 50, conductive layer 60, and insulating layer 70 are disposed at the other side in the thickness direction of the metal core layer 10. The insulating layer 20 of the laminate Y1 has a region 22 with a hole 22c and at least one opening 23 adjacent to the region 22. The conductive layer 30 of the laminate Y1 includes a wiring portion 31 and a conductive portion 32, where the wiring portion 31 is disposed at least on the region 22 at one side in the thickness direction of the insulating layer 20 and the conductive portion 32 is disposed in the hole 22c and connected to the wiring portion 31 and the metal core layer 10. The insulating layer 40 of the laminate Y1 covers the conductive layer 30 at one side in the thickness direction of the insulating layer 20, and has an opening 41 communicating with the opening 23 of the insulating layer 20. The insulating layer 50 of the laminate Y1 includes a hole 52c and at least one opening 53, where the hole 52c includes a part facing the region 22 of the insulating layer 20 and a hole 52c in the facing part, and the opening 53 is adjacent to the region 52. The conductive layer 60 of the laminate Y1 includes a wiring portion 61 and a conductive portion 62, where the wiring portion 61 is disposed at least on the region 52 at the other side in the thickness direction of the insulating layer 50 and the conductive portion 62 is disposed in the hole 52c and connected to the wiring portion 61 and the metal core layer 10. The insulating layer 70 of the laminate Y1 covers the conductive layer 60 at the other side in the thickness direction of the insulating layer 50, and has openings 71 communicating with the openings 53 of the insulating layer 50. Similarly to the description of the wiring circuit board X1 with reference to FIG. 5, in the projective view in the thickness direction of the laminate Y1, the openings 23 of the insulating layer 20 and the openings 53 of the insulating layer 50 overlap or are connected to each other and surround the conductive portions 32 and 62. The openings 41 of the insulating layer 40 have opening shapes identical or substantially identical to the openings 23. The openings 71 of the insulating layer 70 have opening shapes identical or substantially identical to the openings 53.

Figure 12D:
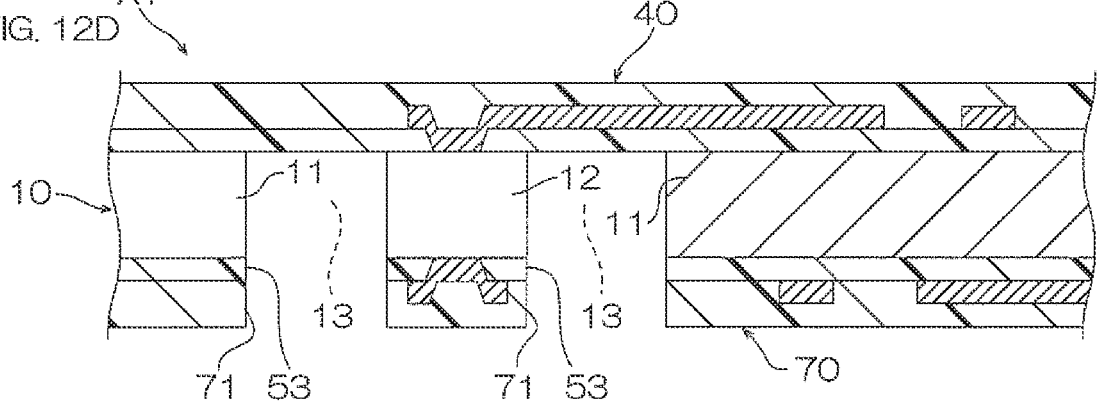
FIG. 12D illustrates an etching step.
Figure 14D:
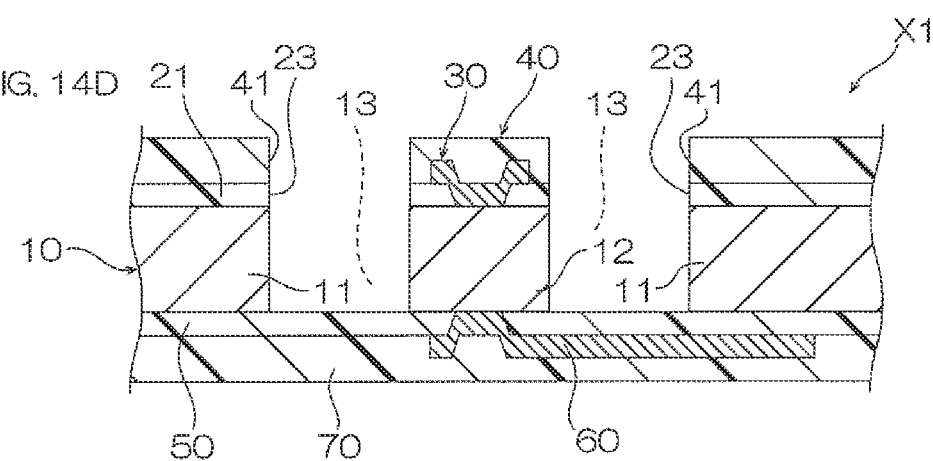
FIG. 14D illustrates an etching step.

In the present manufacturing method, as illustrated in FIG. 12D and FIG. 14D, next, the metal core layer 10 is subject to an etching process to form the core layer principal portion 11 and the via portion 12 in the metal core layer 10 (etching step). For example, ferric chloride is used as the etching solution for the etching process.

The etching process of this step includes a first etching treatment and a second etching treatment. The first etching treatment is carried out to etch the metal core layer 10 from one side in the thickness direction of the laminate Y1 through the openings 23 and 41 of the insulating layers 20 and 40. The second etching treatment is carried out to etch the metal core layer 10 from the other side in the thickness direction of the laminate Y1 through the openings 53 and 71. In this step, the first and second etching treatments can simultaneously be carried out, the second etching treatment can be carried out after the completion of the first etching treatment, or the first etching treatment can be carried out after the completion of the second etching treatment. The simultaneous execution of the first and second etching treatments is preferred. By such an etching step, the via portion 12 having a periphery surrounded by the space 13 is formed in the metal core layer 10, where the via portion 12 extends between the region 22 of the insulating layer 20 and the region 52 of the insulating layer 50 in the thickness direction to connect the conductive portions 32 and 62.

In the projective view in the thickness direction of the laminate Y1, the openings 23 and 41 of the insulating layers 20 and 40 and the openings 53 and 71 of the insulating layers 50 and 70 overlap each other and surround the conductive portions 32 and 62. Such a structure achieves an appropriate formation of the space 13 surrounding the via portion 12 in the metal core layer 10, by the first etching treatment for etching the metal core layer 10 through the openings 23 and 41 and the second etching treatment through the openings 53 and 71.

In the present embodiment, the first and second etching treatments preferably include an etching process to form an outer edge of the metal core layer 10 in the projective view. This allows for the simultaneous formation of the via portion 12 in the metal core layer 10 and the outer edge of the metal core layer 10. Alternatively, the etching process for the formation of the outer edge of the metal core layer 10 may be carried out separately from the etching step for the formation of the via portion 12.

As described above, the wiring circuit board X1 including the metal core layer 10 with the via portion 12 is manufactured.

The present manufacturing method includes the first etching treatment and the second etching treatment to form the via portion 12 in the metal core layer 10 so as to electrically connect the conductive layer 30 and conductive layer 60, which are disposed at one side and the other side in the thickness direction of the wiring circuit board X1 including the metal core layer 10. The method does not require providing for an insulating film or the like for insulating the via portion 12 from the other portions in the metal core layer 10. Thus, the method is suitable for reducing the number of steps of forming the via portion 12, which electrically connects the conductive layers 30 and 60, in the manufacturing process of the wiring circuit board X1 including the metal core layer 10. The method is suitable to carry out the etching for forming the outer edge of the metal core layer 10 in the first and second etching treatments, and thus suitably reduces the number of the steps. The method suitably reducing the number of the steps as described above is suitable to efficiently manufacture the wiring circuit board X1 with the metal core layer 10.

Further, the present method, where the formation of the space 13 in the metal core layer 10 forms a conductive structure or the via portion 12 electrically connecting the circuits on both the surfaces, allows for an appropriate electrical connection between the circuits on both the surfaces even through a thick metal core layer 10.

As described above, the simultaneous execution of the first etching treatment and the second etching treatment is preferable for the present embodiment. Such a composition is suitable for reducing the number of the steps of the manufacturing process of the wiring circuit hoard X1 with the metal core layer 10, and thus suitable to efficiently manufacture the wiring circuit boards X1.

The present embodiment demonstrates, as described above, that the laminate Y1 for the etching step of FIG. 12D and FIG. 14D includes the insulating layer 40 and the insulating layer 70. The insulating layer 40 covers the conductive layer 30 at one side in the thickness direction of the insulating layer 20, and has the openings 41 which function as etching windows by communicating with the openings 23 of the insulating layer 20. The insulating layer 70 covers the conductive layer 60 at the other side in the thickness direction of the insulating layer 50, and has the openings 71 which function as etching windows by communicating with the openings 53 of the insulating layer 50. Such a structure is suitable to carry out the first and second etching treatments without additional preparation of etching masks for covering and protecting the conductive layer 30 and the conductive layer 60, and thus suitable for reducing the number of the steps.

Figure 15A:
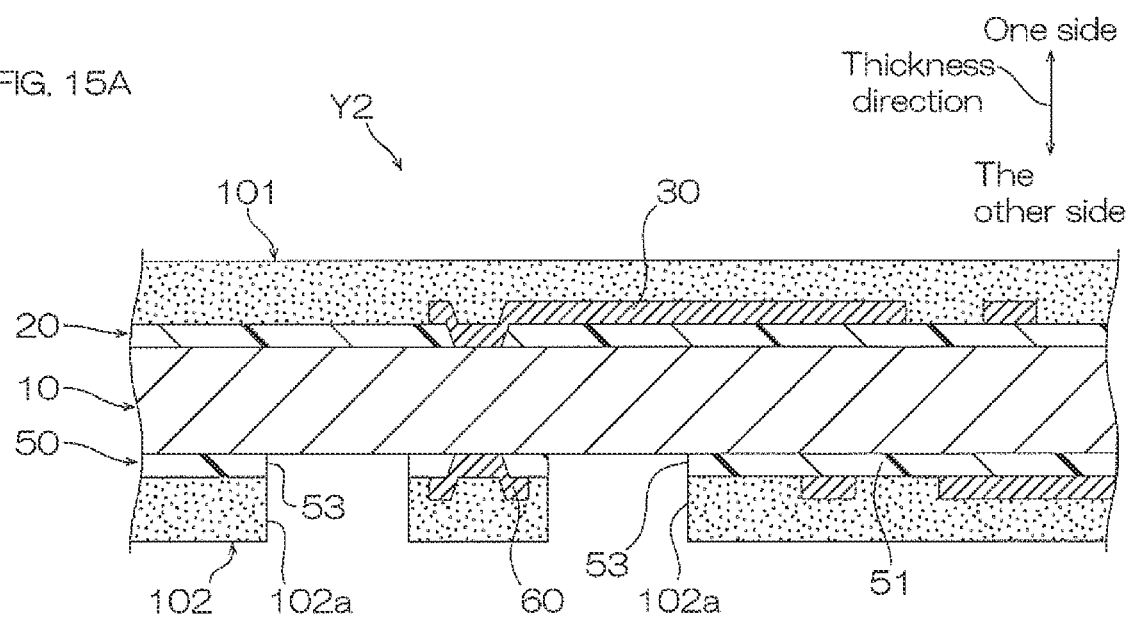
FIG. 15A illustrates a cross section corresponding to the cross section of FIG. 1.
Figure 15B:
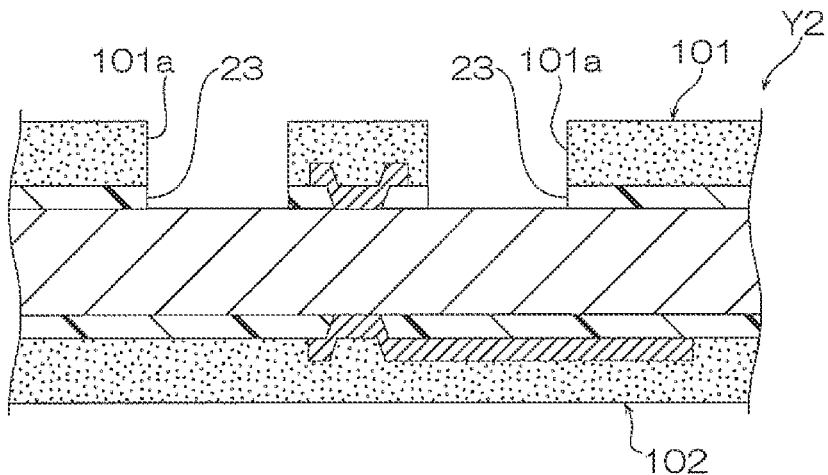
FIG. 15B illustrates a cross section corresponding to the cross section of FIG. 4.
Figure 16:
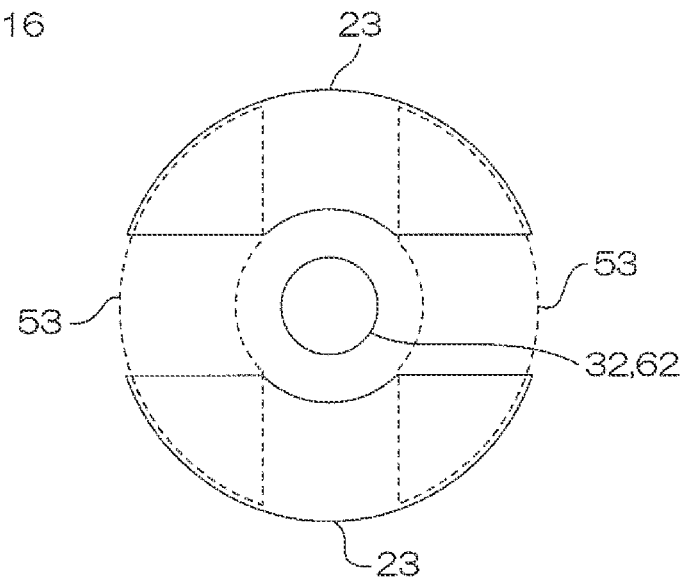
FIG. 16 illustrates the shapes of a first opening, a second opening, a first conductive portion, and a second conductive portion when the laminate of FIG. 15 is projected in a thickness direction.

The manufacturing method of the wiring circuit board X1 may use a laminate Y2 provided with resist masks 101 and 102 in place of the insulating layers 40 and 70 as illustrated in FIG. 15A and FIG. 15B to carry out the etching step to etch the metal core layer 10. FIG. 15A illustrates a cross section corresponding to that of FIG. 1. FIG. 15B illustrates a cross section corresponding to that of FIG. 4. FIG. 16 shows a projective view in the thickness direction of the laminate Y2, where openings 23 of an insulating layer 20 and openings 53 of an insulating layer 50 overlap and form a circular shape and surround conductive portions 32 and 62. FIG. 15 shows the laminate Y2, where the resist mask 101 is disposed at one side in the thickness direction of the insulating layer 20 to cover a conductive layer 30 and has a pattern shape with openings 101a. The openings 101a are communicated with the openings 23, and have opening shapes identical or substantially identical to the openings 23. The resist mask 102 is disposed at one side in the thickness direction of the insulating layer 50 to cover the conductive layer 60, and has a pattern shape with openings 102a. The openings 102a are communicated with the openings 53, and have opening shapes identical or substantially identical to the openings 53.

The laminate Y2 is produced through, for example, the preparation step (see FIGS. 11A and 13A), the first insulating layer formation step (see FIGS. 11B and 13B), the subsequent conductive layer formation step (see FIGS. 11C and 13C), the second insulating layer formation step (see FIGS. 12A and FIG. 14A), the subsequent second conductive layer formation step (see FIGS. 12B and FIG. 14B), the first resist mask formation step of forming the resist mask 101 after the first conductive layer formation step, and the second resist mask formation step of forming the resist mask 102 after the second conductive layer formation step. In the first resist mask formation step, the resist mask 101 is formed, for example, by patterning the photosensitive resist film covering the conductive layer 30 at one side in the thickness direction of the insulating layer 20. In the second resist mask formation step, the resist mask 102 is formed, for example, by patterning the photosensitive resist film covering the conductive layer 60 at the other side in the thickness direction of the insulating layer 50.

Figure 17A:
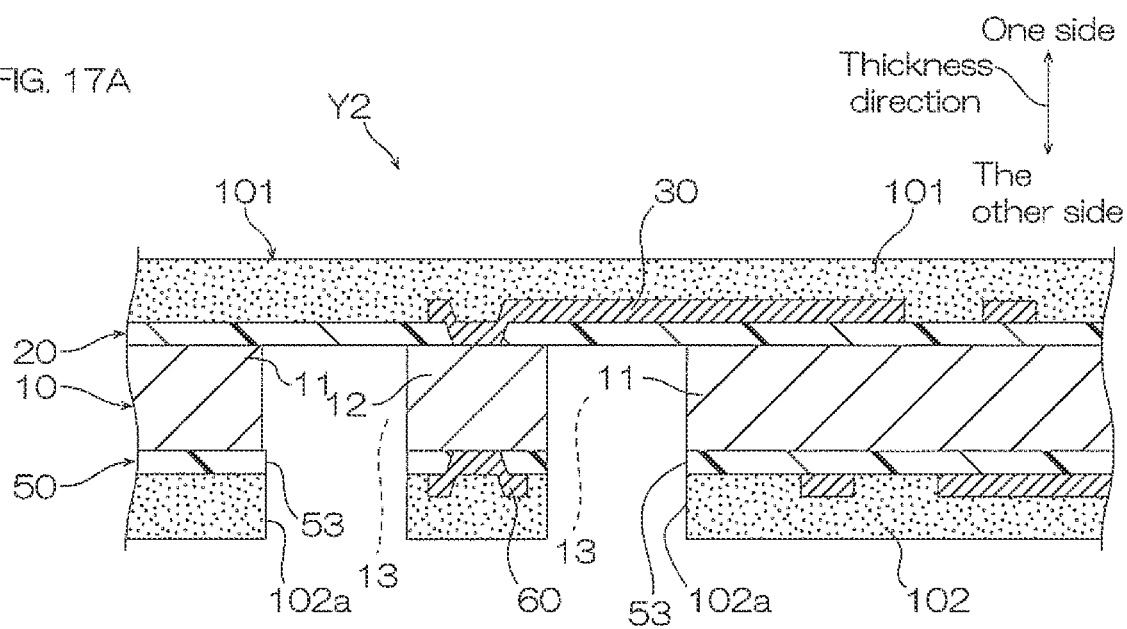
FIG. 17A illustrates a cross section corresponding to the cross section of FIG. 15A.
Figure 17B:
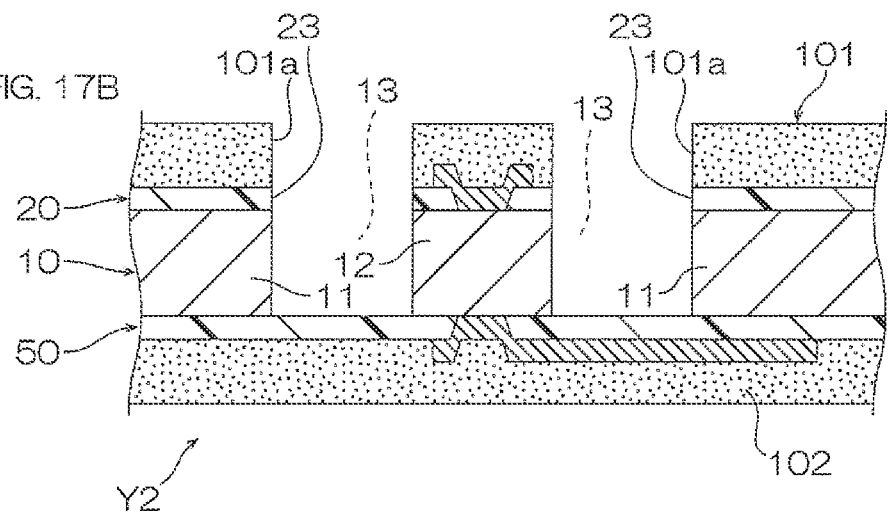
FIG. 17B illustrates a cross section corresponding to the cross section of FIG. 15B.

In the etching step of the present variation, the laminate Y2 is used to carry out the first etching treatment and the second etching treatment to etch the metal core layer 10 so as to form the core layer principal portion 11 and the via portion 12 in the metal core layer 10 as illustrated in FIG. 17A and FIG. 17B. FIG. 17A illustrates a cross section corresponding to that of FIG. 15A. FIG. 17B illustrates a cross section corresponding to that of FIG. 15B.

The first etching treatment of the present variation is carried out to etch the metal core layer 10 from one side in the thickness direction of the laminate Y2 through the openings 23 of the insulating layer 20 and the openings 101a of the resist mask 101. The second etching treatment of the present variation is carried out to etch the metal core layer 10 from the other side in the thickness direction of the laminate Y2 through the openings 53 of the insulating layer 50 and the openings 102a of the resist mask 102. The first and second etching treatments of this step can simultaneously be carried out, the second etching treatment can be carried out after the completion of the first etching treatment, or the first etching treatment can be carried out after the completion of the second etching treatment. The simultaneous execution of the first and second etching treatments is preferred for the reduction in the number of the steps. In the etching step, the via portion 12 having a periphery surrounded by the space 13 is formed in the metal core layer 10, while the via portion 12 extends between the region 22 of the insulating layer 20 and the region 52 of the insulating layer 50 in the thickness direction and is connected to the conductive portions 32 and 62.

After the etching step, the resist masks 101 and 102 are removed from the aminate Y2.

Alternatively, through the above-mentioned steps of the present variation, the wiring circuit board X1 having the metal core layer 10 including the via portion 12 surrounded by the space 13 may be manufactured. The present method has the same effects and merits as those of the first embodiment.

As necessary, the present method may include the first insulating cover layer formation step and the second insulating cover layer formation step, thereby forming the insulating layer 40, i.e., an insulating cover layer as described above with reference to FIG. 11D and FIG. 13D, and forming the insulating layer 70, i.e., an insulating cover layer as described above with reference to FIG. 12C and FIG. 14C, respectively.

Figure 18:
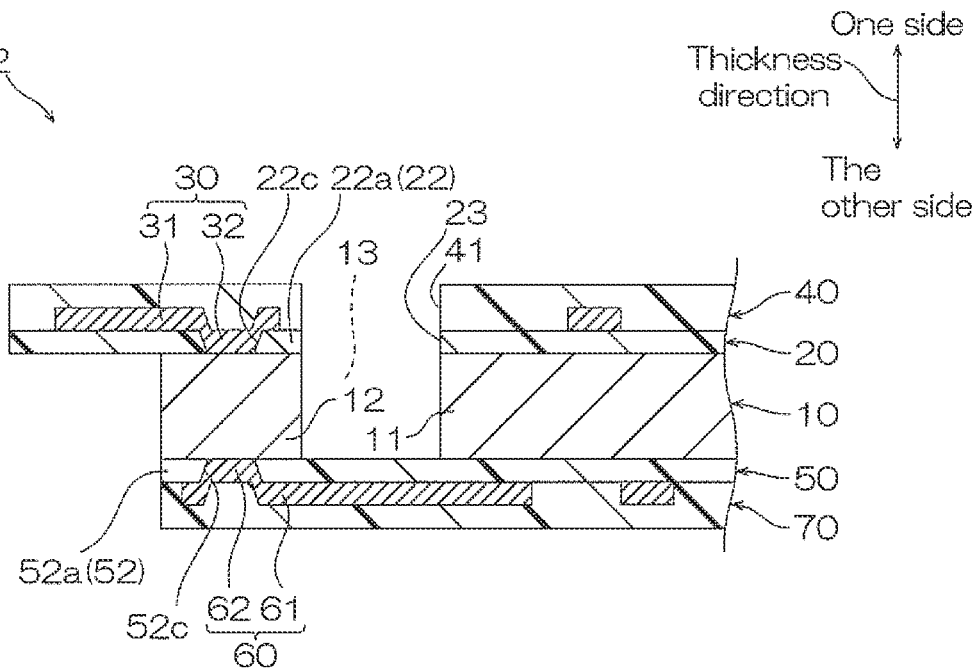
FIG. 18 is a cross-sectional view of the second embodiment of the double-sided wiring circuit board of the present invention.
Figure 19:
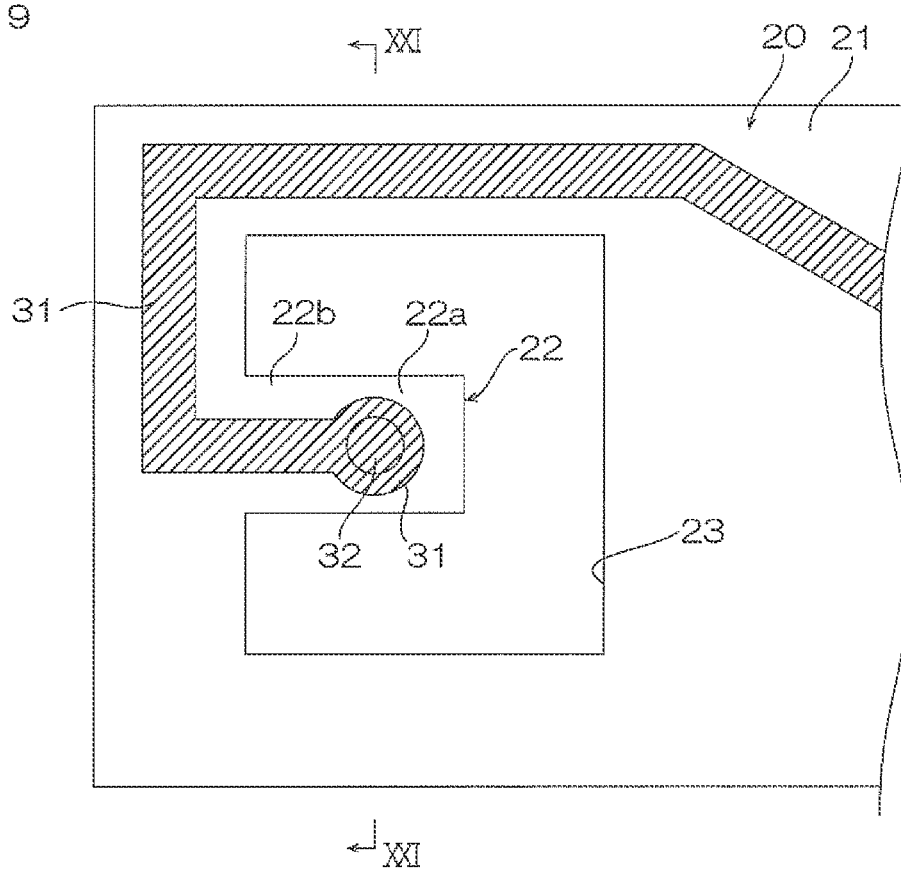
FIG. 19 is a partial top view of the double-sided wiring circuit board illustrated in FIG. 18.
Figure 20:
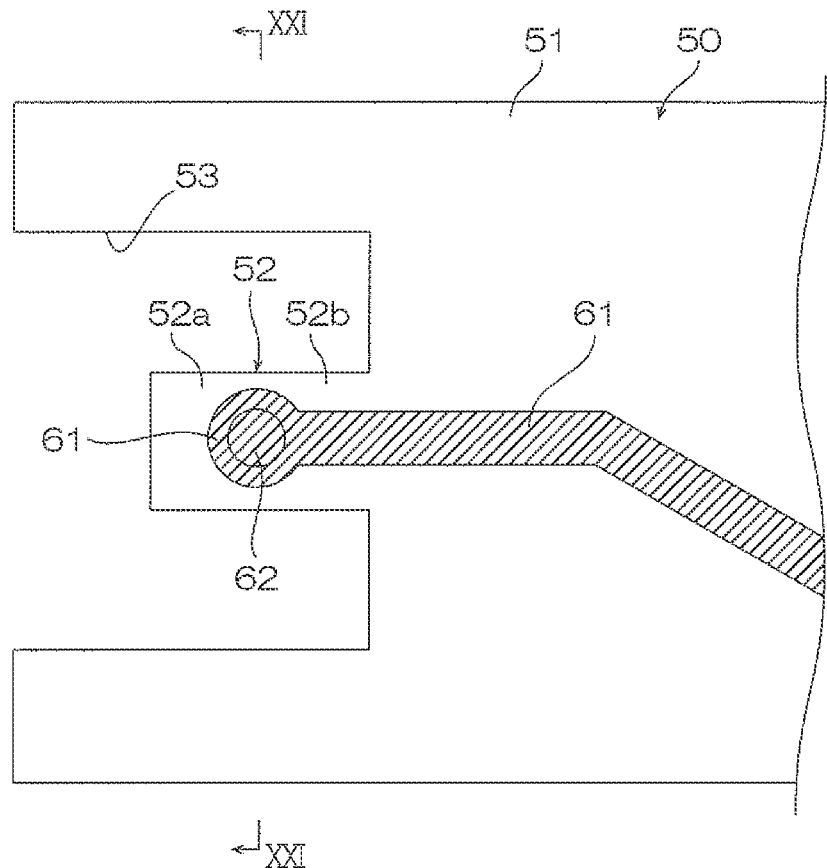
FIG. 20 is a partial bottom view of the double-sided wiring circuit board illustrated in FIG. 18.
Figure 21:
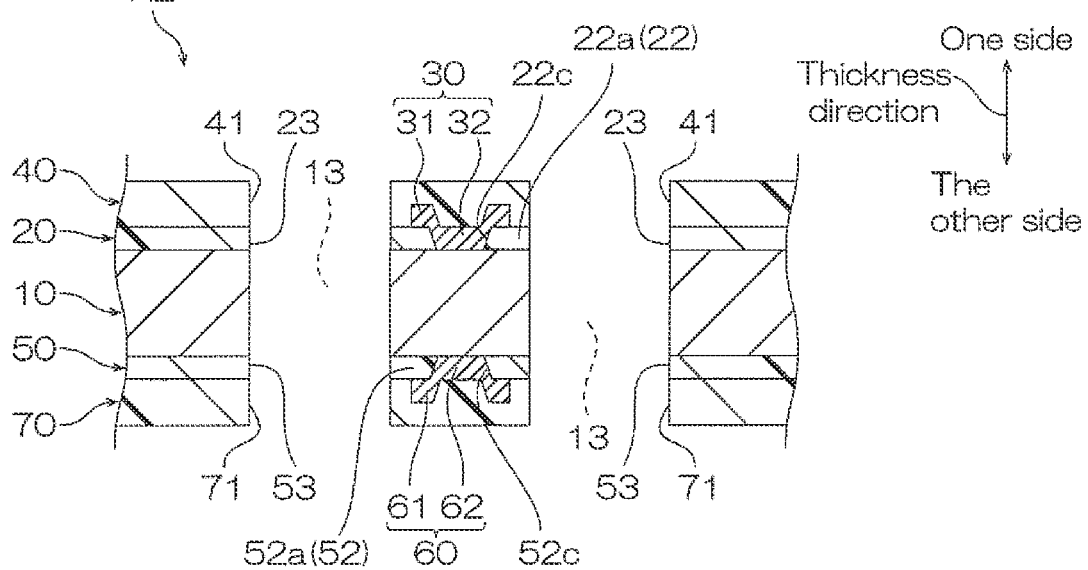
FIG. 21 is a cross-sectional view of a part taken along line XXI-XXI of FIG. 19 and FIG. 20.
Figure 22:
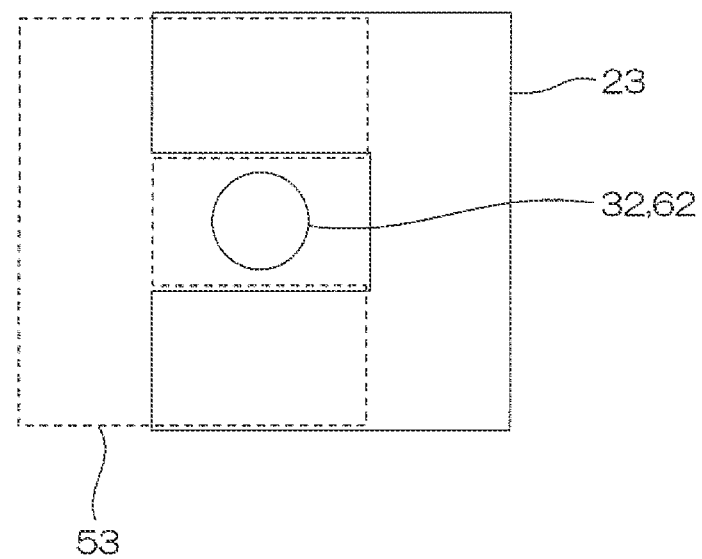
FIG. 22 illustrates the shapes of a first opening, a second opening, a first conductive portion, and a second conductive portion when the double-sided wiring circuit board shown in FIG. 18 is projected in a thickness direction.

FIG. 18 to FIG. 21 illustrate a wiring circuit hoard X2 of the second embodiment of the present invention. FIG. 18 is a schematic cross-sectional view of the wiring circuit board X2. FIG. 19 is a partial top view of the wiring circuit board X2, although not illustrating an insulating layer 40. FIG. 20 is a partial bottom view of the wiring circuit board X2 although not illustrating an insulating layer 70. FIG. 21 is a cross-sectional view of a part taken along line XXI-XXI of FIG. 19 and FIG. 20.

The wiring circuit board X2 is the same as the wiring circuit board X1 except for the following. The same members are given the same reference numerals.

A via portion 12 is located at a predetermined end, in the projective view, of a metal core layer 10 of the wiring circuit board X2.

A region 22 and an opening 23 are also located at the predetermined end relative to the position of the via portion 12 in an insulating layer 20 of the wiring circuit board X2.

As illustrated in FIG. 19, the region 22 has a rectangular shape in the projective view, and has an inside part 22a forming a free end. One coupling part 22b that couples the inside part 22a with a principal portion 21 is provided thereto.

The opening 23 has an approximate U shape in the projective view, holding the region 22. The projective U shape has an open close to an edge of the insulating layer 20. In the present embodiment, the region 22 and the opening 23 form an approximately rectangular shape in the projective view.

The wiring circuit board X2 includes a wiring portion 31 having one end on the inside part 22a, passing above the coupling part 22b, and extending from the open end of the U shape of the opening 23 to the outside of the region 22.

The wiring circuit board X2 includes an insulating layer 40 having an opening 41 that has a U shape open at a side close to an edge of the insulating layer 20 in the projective view, similarly to the opening 23.

A region 52 and an opening 53 are located at the predetermined end relative to the position of the via portion 12 in an insulating layer 50 of the wiring circuit board X2.

As illustrated in FIG. 20, the region 52 has a rectangular shape in the projective view, and has an inside part 52a forming a free end. One coupling part 52b coupling the inside part 52a with the principal portion 51 is provided thereto. The coupling part 52b is located at an opposite side to the coupling part 22b relative to the via portion 12.

The opening 53 is formed into a notch by notching the insulating layer 50 from a predetermined edge. The opening 53 has an approximate U shape holding the region 52 in the projective view. The projective U shape has an open end opposite to the side close to the edge of the insulating layer 50.

The wiring circuit board X2 includes a wiring portion 61 having one end on the inside part 52a, passing above the coupling part 52b, and extending from the open end of the U shape of the opening 53 (or the side opposite to the open end of the U shape of the opening 23) to the outside of the region 52.

In the projective view in the thickness direction of the wiring circuit hoard X2, the openings 23 and the openings 53 overlap each other and form a rectangular frame shape, and surround the via portion 12. In the present embodiment, the openings 23 and 53 provide for such an opening shape.

FIG. 23 to FIG. 26 illustrate a method for manufacturing the wiring circuit board X2. FIG. 23 and FIG. 24 illustrate the manufacturing method as the changes in the cross section corresponding to FIG. 18. FIG. 25 and FIG. 26 illustrate the manufacturing method as the changes in the cross section corresponding to FIG. 21. The details of the implementation of the following steps are the same as those of the corresponding steps in the manufacturing method of the wiring circuit board X1.

Figure 23A:
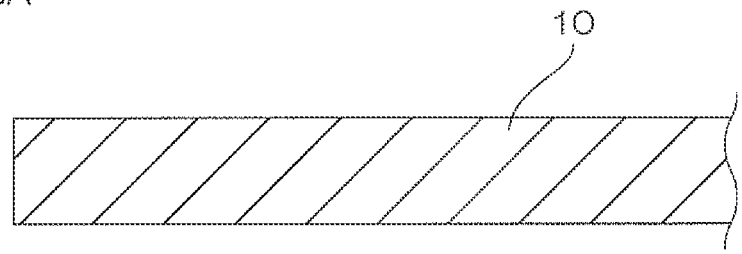
FIG. 23A illustrates a preparation step.
Figure 25A:
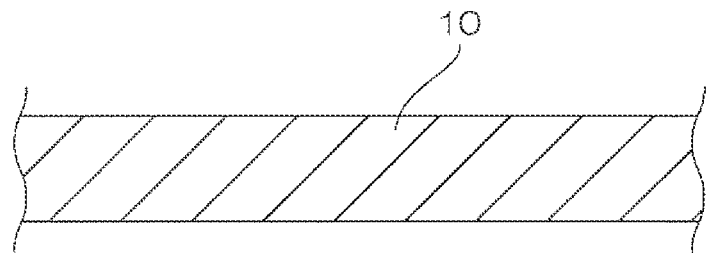
FIG. 25A illustrates a preparation step.

For the manufacturing method, first, the metal core layer 10 is prepared as illustrated in FIG. 23A and FIG. 25A (preparation step).

Figure 23B:
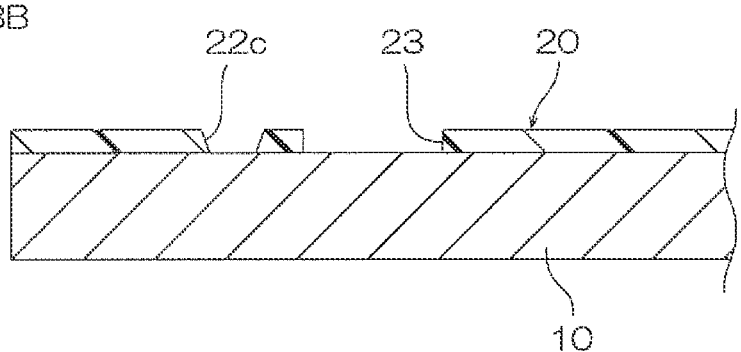
FIG. 23B illustrates a step of forming a first insulating base layer.
Figure 25B:
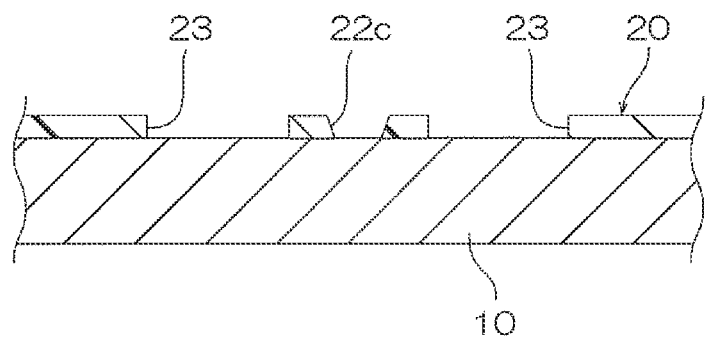
FIG. 25B illustrates a step of forming a first insulating base layer.

Next, as illustrated in FIG. 23B and FIG. 25B, the insulating layer 20, i.e., an insulating base layer is formed on the metal core layer 10 (first insulating base layer formation step).

Figure 23C:
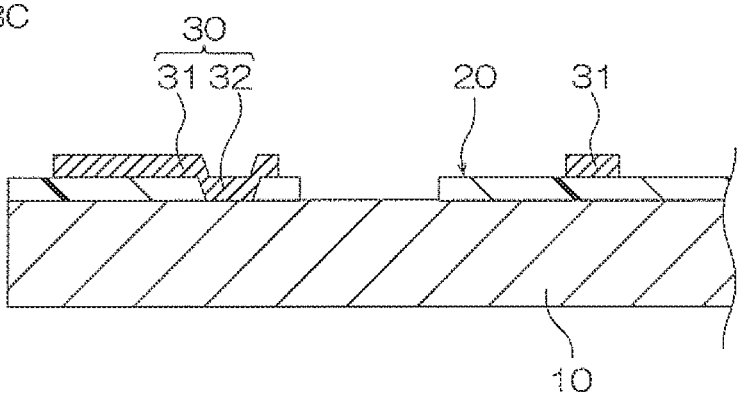
FIG. 23C illustrates a step of forming a first conductive layer.
Figure 25C:
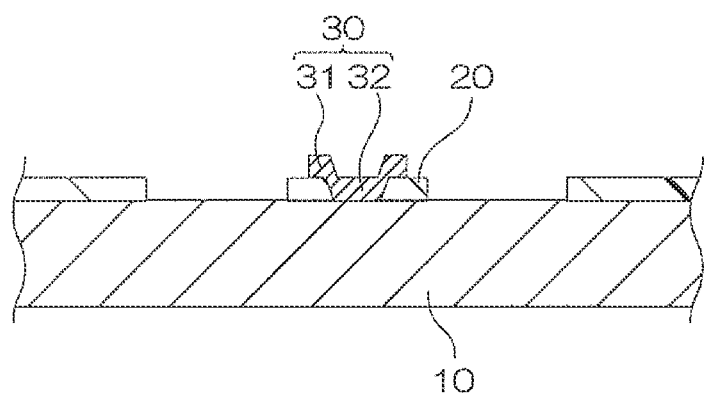
FIG. 25C illustrates a step of forming a first conductive layer.

Next, as illustrated in FIG. 23C and FIG. 25C, the conductive layer 30 is formed on the insulating layer 20 (first conductive layer formation step).

Figure 23D:
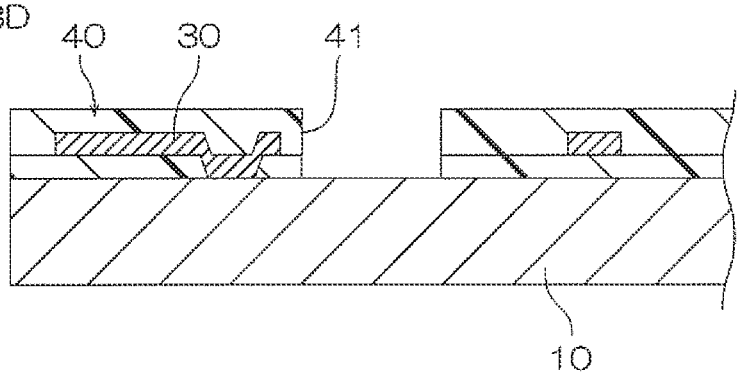
FIG. 23D illustrates a step of forming a first insulating cover layer.
Figure 25D:
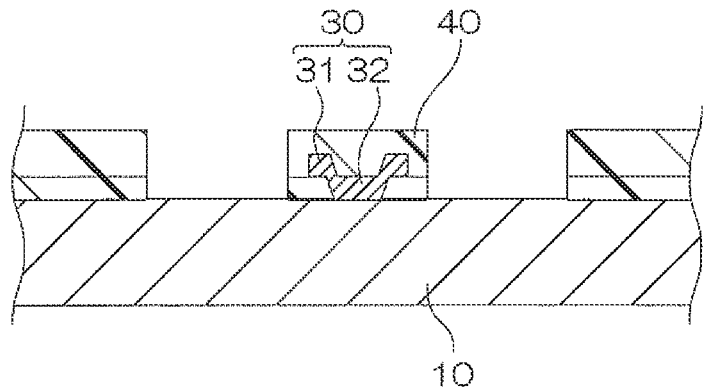
FIG. 25D illustrates a step of forming a first insulating cover layer.

Next, as illustrated in FIG. 23D and FIG. 25D, the insulating layer 40, i.e., an insulating cover layer is formed at one side in the thickness direction of the insulating layer 20 to cover the conductive layer 30 (first insulating cover layer formation step).

Figure 24A:
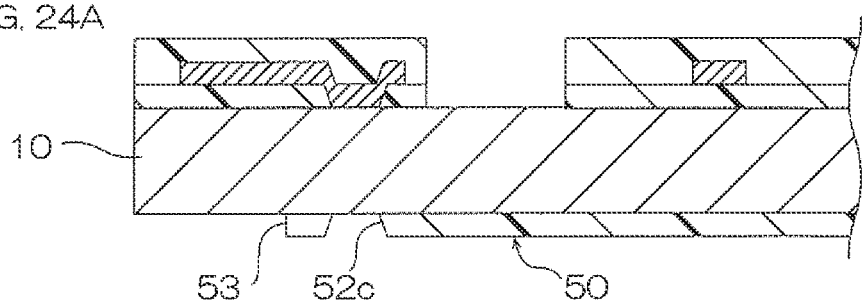
FIG. 24A illustrates a step of forming a second insulating base layer.
Figure 26A:
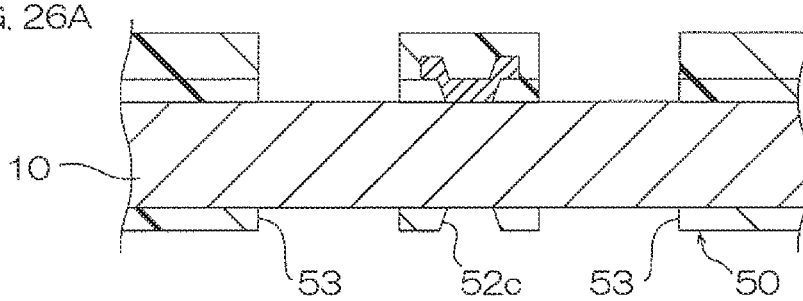
FIG. 26A illustrates a step of forming a second insulating base layer.

Next, as illustrated in FIG. 24A and FIG. 26A, the insulating layer 50, i.e., an insulating base layer is formed on the metal core layer 10 (second insulating base layer formation step).

Figure 24B:
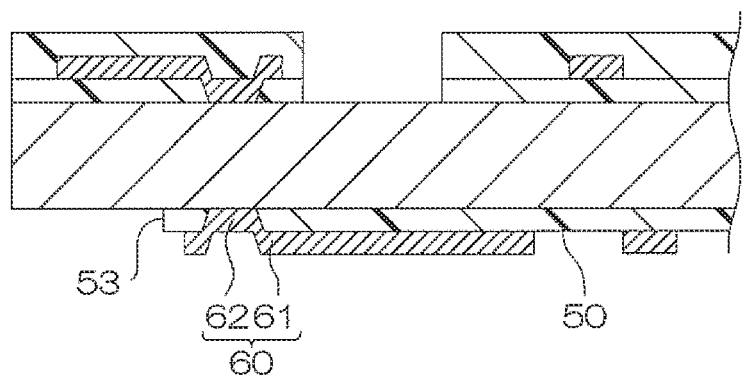
FIG. 24B illustrates a step of forming a second conductive layer.
Figure 26B:
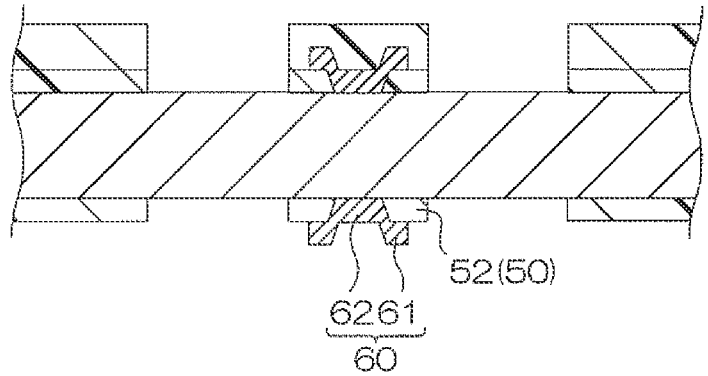
FIG. 26B illustrates a step of forming a second conductive layer.

Next, as illustrated in FIG. 24B and FIG. 26B, the conductive layer 60 is formed on the insulating layer 50 (second conductive layer formation step).

Figure 24C:
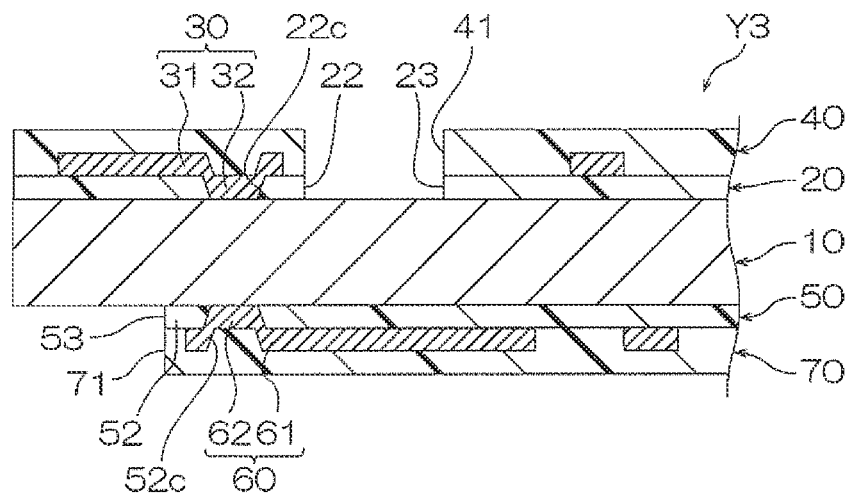
FIG. 24C illustrates a step of forming a second insulating cover layer.
Figure 26C:
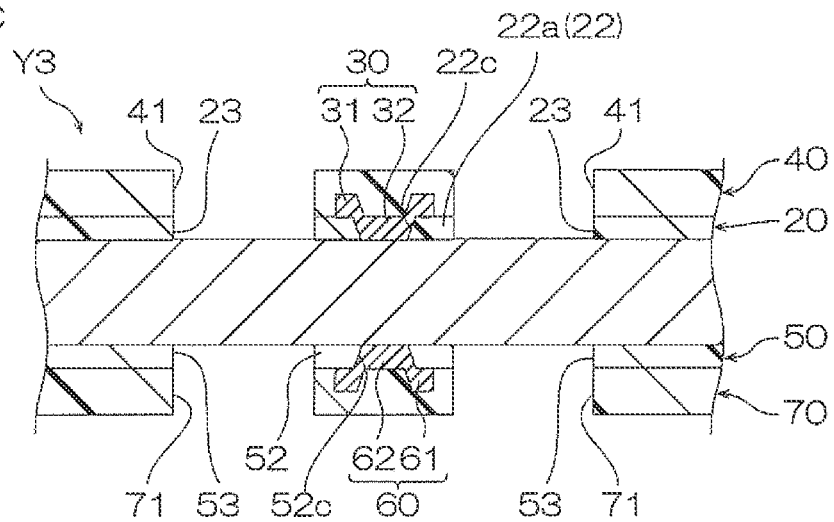
FIG. 26C illustrates a step of forming a second insulating cover layer.

Next, as illustrated in FIG. 24C and FIG. 26C, the insulating layer 70, i.e., an insulating cover layer is formed at the other side in the thickness direction of the insulating layer 50 to cover the conductive layer 60 (second insulating cover layer formation step).

Through the above-described steps of the present embodiment, a laminate Y3 is manufactured as an intermediate product.

Figure 24D:
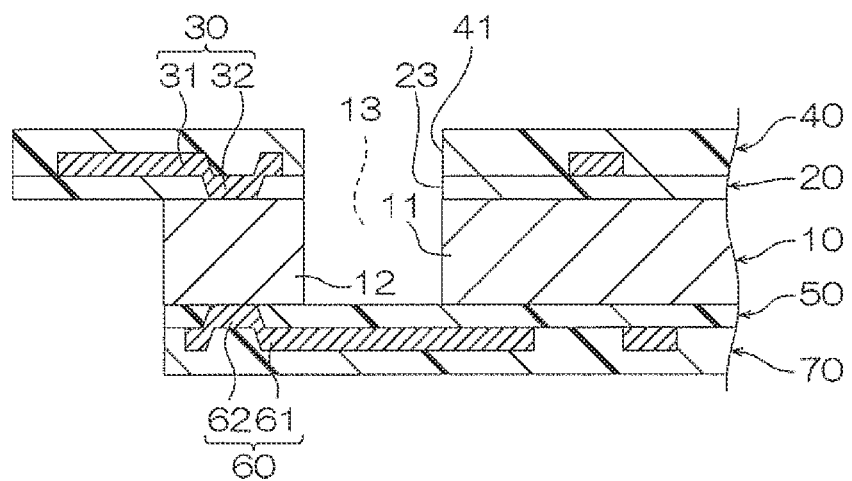
FIG. 24D illustrates an etching step.
Figure 26D:
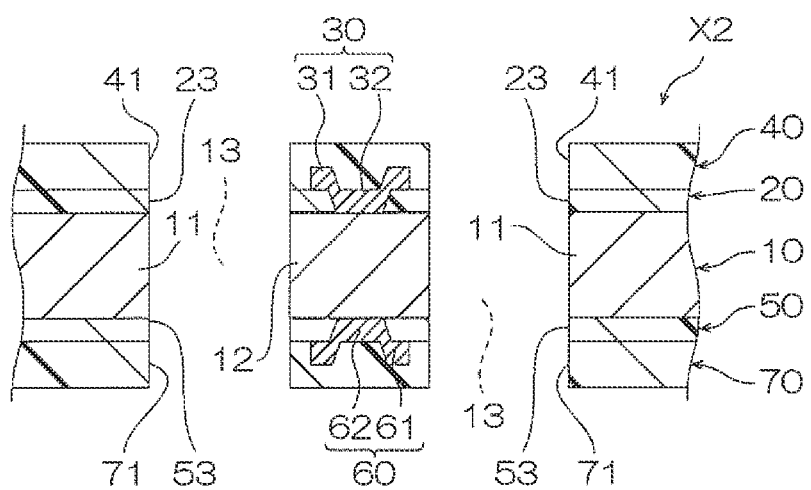
FIG. 26D illustrates an etching step.

In the present manufacturing method, next, the metal core layer 10 is etched in an etching process to form the core layer principal portion 11 and the via portion 12 in the metal core layer 10 as illustrated in FIG. 24D and FIG. 26D (etching step).

The opening 53 of the present embodiment is formed as a notch. This allows an etching process for processing the outer shape of the metal core layer 10 to be carried out in the first and second etching treatments. This allows for the simultaneous execution of the formation of the via portion 12 in the metal core layer 10 and the process of the outer shape of the metal core layer 10.

As described above, the wiring circuit board X2 having the via portion 12 at an end of the metal core layer 10 is manufactured.

The wiring circuit board X2 and the method of manufacturing thereof have the same effects and merits as the wiring circuit board X1 and the method of manufacturing thereof.

Figure 27A:
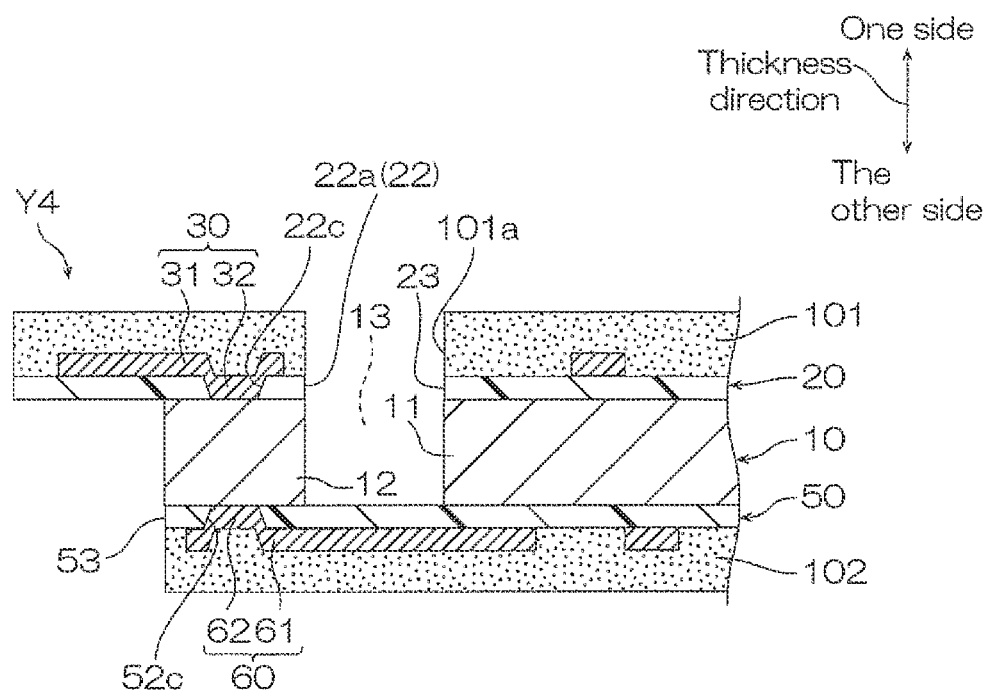
FIG. 27A illustrates a cross section corresponding to the cross section of FIG. 18.
Figure 27B:
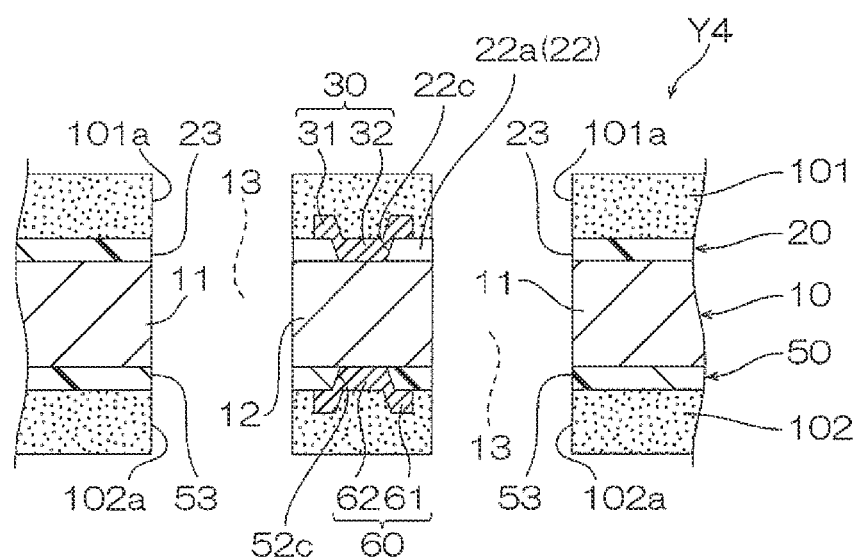
FIG. 27B illustrates a cross section corresponding to the cross section of FIG. 21.

The manufacturing method of the wiring circuit board X2 may use a laminate Y4 provided with resist masks 101 and 102 in place of the insulating layers 40 and 70 as illustrated in FIG. 27 to carry out the etching step of etching the metal core layer 10. The details are the same as the implementation of the etching step using the laminate Y2 of the wiring circuit board X1 described above.

The embodiments and variations of the present invention can appropriately be carried out in combination.

INDUSTRIAL APPLICABILITY

The techniques related to the double-sided wiring circuit board of the present invention apply to, for example, various flexible wiring boards.

DESCRIPTION OF REFERENCE NUMERALS

X1, X2 wiring circuit board (double-sided wiring circuit board)
Y1, Y2, Y3, Y4 laminate
10 metal core layer
11 core layer principal portion
12 via portion
13 space
20, 40, 50, 70 insulating layer
21, 51 principal portion
22, 52 region
22a, 52a hole
23, 41, 53, 71 opening
30, 60 conductive layer
31, 61 wiring portion
32, 62 conductive portion

The invention claimed is:

1. A manufacturing method for a double-sided wiring circuit board, the method comprising:
   a first step of preparing a laminate including:
      a metal core layer,
      a first insulating layer disposed at one side in a thickness direction of the metal core layer, and having a first region and at least one first opening adjacent to the first region, the first region having a first hole,
      a first conductor layer having a first wiring portion and a first conductive portion, the first wiring portion being disposed at least on the first region at one side in the thickness direction of the first insulating layer, the first conductive portion being disposed in the first hole and connected to the first wiring portion and the metal core layer,
      a second insulating layer disposed at an opposite side in the thickness direction of the metal core layer, and having a second region and at least one second opening adjacent to the second region, the second region including a part facing to the first region in the thickness direction, the second region having a second hole in the part, and
      a second conductor layer having a second wiring portion and a second conductive portion, the second wiring portion being disposed at least on the second region at an opposite side in the thickness direction of the second insulating layer, the second conductive portion being disposed in the second hole and connected to the second wiring portion and the metal core layer; and
   a second step of forming a via portion in the metal core layer by a first etching treatment on the metal core layer through the first opening from one side in the thickness direction of the laminate, and by a second etching treatment on the metal core layer through the second opening from an opposite side in the thickness direction of the laminate, the via portion being surrounded by a space, extending between the first region and the second region in the thickness direction, and being connected to the first conductive portion and the second conductive portion.

2. The manufacturing method according to claim 1, wherein the first etching treatment and the second etching treatment are simultaneously carried out.

3. The manufacturing method according to claim 1, wherein, in a projective view in the thickness direction, the first opening and the second opening are connected to each other, and surround the first conductive portion and the second conductive portion.

4. The manufacturing method according to claim 1, wherein the laminate further including:
- a third insulating layer covering the first conductor layer at the one side in the thickness direction of the first insulating layer, and having a third opening communicating with the first opening; and
- a fourth insulating layer covering the second conductor layer at an opposite side in the thickness direction of the second insulating layer, and having a fourth opening communicating with the second opening.

5. A double-sided wiring circuit board comprising:
- a metal core layer including a via portion surrounded by a space, and a core layer principal portion adjacent to the via portion through the space;
- a first insulating layer disposed at one side in a thickness direction of the metal core layer, and having a first region and at least one first opening adjacent to the first region, the first region having a first hole;
- a first conductor layer having a first wiring portion and a first conductive portion, the first wiring portion being disposed at least on the first region at one side in the thickness direction of the first insulating layer, the first conductive portion being disposed in the first hole and connected to the first wiring portion and the metal core layer;
- a second insulating layer disposed at an opposite side in the thickness direction of the metal core layer, and having a second region and at least one second opening adjacent to the second region, the second region including a part facing to the first region in the thickness direction, the second region having a second hole in the facing part; and
- a second conductor layer having a second wiring portion and a second conductive portion, the second wiring portion being disposed at least on the second region at an opposite side in the thickness direction of the second insulating layer, the second conductive portion being disposed in the second hole and connected to the second wiring portion and the metal core layer.

6. The double-sided wiring circuit board according to claim 5, wherein, in a projective view in the thickness direction, the first opening and the second opening are connected to each other, and surround the first conductive portion and the second conductive portion.

* * * * *